(12) United States Patent
Chen et al.

(10) Patent No.: US 12,672,341 B2
(45) Date of Patent: Jun. 30, 2026

(54) NANOSHEET DEVICES AND METHODS OF FABRICATING THE SAME

(71) Applicant: Taiwan Semiconductor Manufacturing Company, Ltd., Hsinchu (TW)

(72) Inventors: Chia-Chung Chen, Hsinchu (TW); Zi-Ang Su, Hsinchu County (TW); Bo-Ting Chen, Hsinchu (TW); Chung-Sheng Yuan, Hsinchu (TW); Yi-Kan Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 552 days.

(21) Appl. No.: 18/165,639

(22) Filed: Feb. 7, 2023

(65) Prior Publication Data

US 2024/0055424 A1     Feb. 15, 2024

Related U.S. Application Data

(60) Provisional application No. 63/398,027, filed on Aug. 15, 2022.

(51) Int. Cl.
| | |
|---|---|
| *H10D 84/80* | (2025.01) |
| *H03K 17/687* | (2006.01) |
| *H03K 19/0175* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10P 30/20* | (2026.01) |

(52) U.S. Cl.
CPC ......... *H10D 84/811* (2025.01); *H10D 30/014* (2025.01); *H10D 30/43* (2025.01); *H10D 30/6735* (2025.01); *H10D 62/121* (2025.01); *H10D 64/017* (2025.01); *H10P 30/204* (2026.01); *H10P 30/21* (2026.01); *H03K 17/6871* (2013.01); *H03K 19/017509* (2013.01)

(58) Field of Classification Search
None
See application file for complete search history.

(56) References Cited

U.S. PATENT DOCUMENTS

| | | | | |
|---|---|---|---|---|
| 9,847,391 B1* | 12/2017 | Zang | ..................... | H10D 62/121 |
| 2010/0123171 A1* | 5/2010 | Yang | ..................... | H10D 30/603 |
| | | | | 257/272 |
| 2019/0259750 A1 | 8/2019 | Balakrishnan et al. | | |

FOREIGN PATENT DOCUMENTS

| | | |
|---|---|---|
| TW | 201901960 A | 1/2019 |

OTHER PUBLICATIONS

Office Action issued in connection with Taiwan Appl. No. 112112777 dated Nov. 7, 2023.

* cited by examiner

*Primary Examiner* — Alexander G Ghyka
(74) *Attorney, Agent, or Firm* — Foley & Lardner LLP

(57)     ABSTRACT

A semiconductor structure includes a substrate and a stack of p-n junction structures embedded in the substrate. The semiconductor structure includes a semiconductor fin protruding from the substrate. The semiconductor structure includes a pair of source/drain structures disposed in the semiconductor fin. The semiconductor structure includes a gate structure over a channel region of the semiconductor fin and interposed between the pair of source/drain structures.

20 Claims, 20 Drawing Sheets

NANOSHEET DEVICES AND METHODS OF FABRICATING THE SAME

CROSS-REFERENCE TO RELATED APPLICATIONS

The present application claims priority to U.S. Provisional Application Ser. No. 63/398,027, filed Aug. 15, 2022, and titled "Nanosheet Devices and Methods of Fabricating the Same," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, nanosheet devices (or gate-all-around devices) have generally been used in low-voltage IC components due to their $V_{dd}$ constraints. This may pose challenges when designing nanosheet device-based IC chips (e.g., SoC chips) that include high-voltage applications. Furthermore, nanosheet devices may not be easily controlled under high-speed conditions. Accordingly, methods of improving the voltage tolerance of nanosheet devices are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13, 14, 15, 16, and 17 illustrate cross-sectional views along line BB' of the example semiconductor device corresponding to FIG. 12 during intermediate stages of the method of FIG. 1, in accordance with some embodiments.

DETAILED DESCRIPTION

Figure 1:
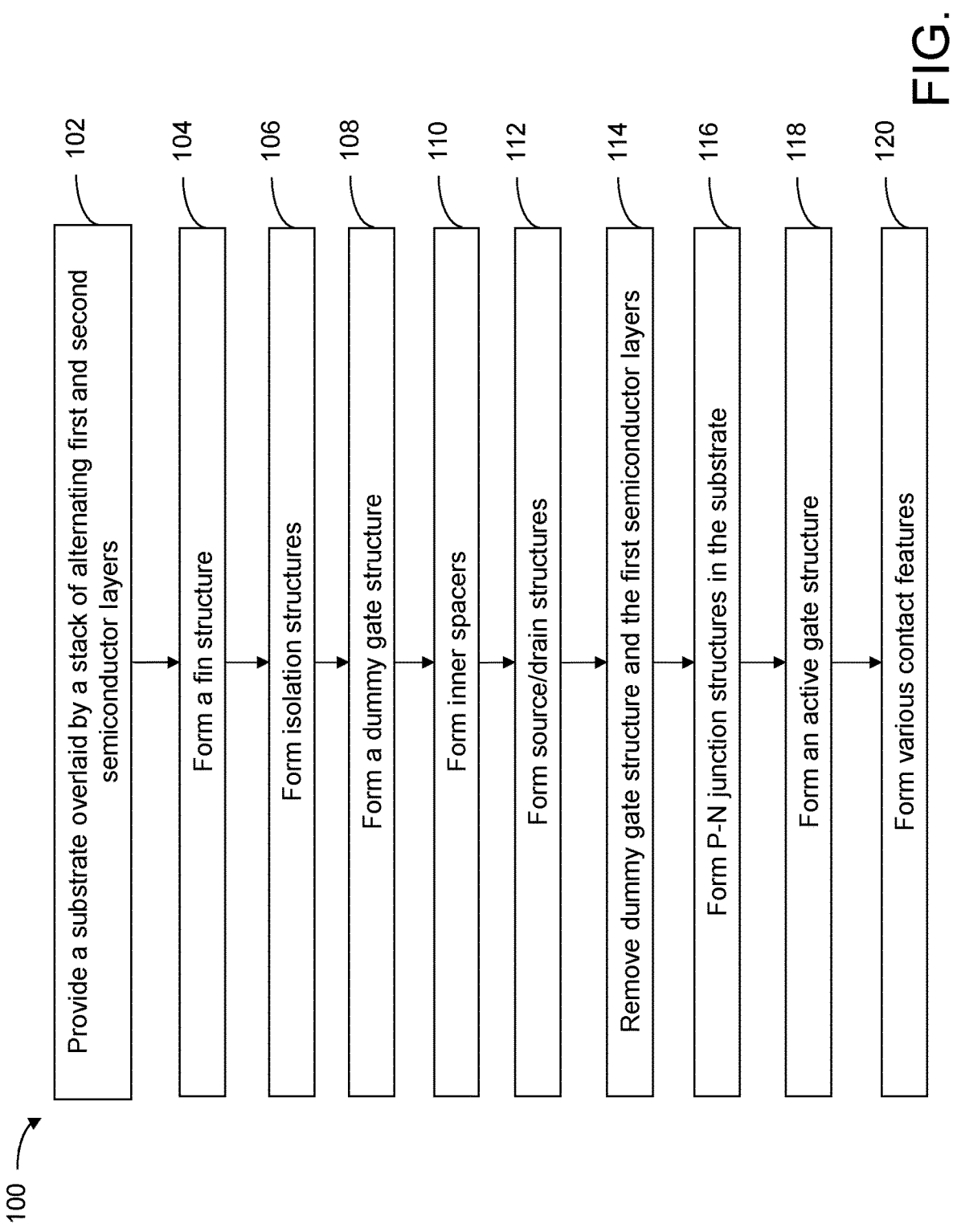
FIG. 1 illustrates a flow chart of an example method to make an example semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as field effect transistors are fabricated on a single wafer. Non-planar transistor device architectures, such as fin-based transistors (typically referred to as "FinFETs"), can provide increased device density and increased performance over planar transistors. Some advanced non-planar transistor device architectures, such as nanosheet (or nanowire) transistors, can further increase the performance over the FinFETs. When compared to the FinFET where the channel is partially wrapped (e.g., straddled) by a gate structure, the nanosheet transistor, in general, includes a gate structure that wraps around the full perimeter of one or more nanosheets for improved control of channel current flow. For example, in a FinFET and a nanosheet transistor with similar dimensions, the nanosheet transistor can present larger driving current ($I_{on}$), smaller subthreshold leakage current ($I_{off}$), and/or other traits. Such a transistor that has a gate structure fully wrapping around its channel may sometimes be referred to as a gate-all-around (GAA) transistor. The present disclosure is generally related to nanosheet devices, and particularly to incorporating junction diodes in nanosheet devices.

FIG. 1 illustrates a flowchart of a method 100 for forming a non-planar transistor device, according to one or more embodiments of the present disclosure. At least some of the operations (or steps) of the method 100 can be used to form a non-planar transistor device such as, for example, a nanosheet transistor device, a nanowire transistor device, a vertical transistor device, or the like. In some embodiments, the method 100 can be used to form a non-planar device (hereafter referred to as the device) 200 in a respective conduction type such as, for example, an n-type transistor device or a p-type transistor device. In some embodiments, the method 100 can be used to form a complementary device including at least one n-type transistor device and at least one p-type transistor device. The term "n-type," as used herein, may be referred to as the conduction type of a transistor device having electrons as its conduction carriers;

and the term "p-type," as used herein, may be referred to as the conduction type of a transistor having holes as its conduction carriers. Although the device 200 is illustrated as a nanosheet (or nanowire) device, it is understood the device 200 may include a number of other devices such as inductors, fuses, capacitors, coils, etc., which are not shown herein, for purposes of clarity.

It is noted that the method 100 is merely an example, and is not intended to limit the present disclosure. Accordingly, it is understood that additional operations may be provided before, during, and after the method 100 of FIG. 1, and that some other operations may only be briefly described herein.

In various embodiments, some operations of the method 100 as shown in FIG. 1 may be associated with three-dimensional perspective views of the device 200 at various fabrication stages as shown in FIGS. 2-17 and 21-23. For purposes of clarity, FIGS. 8, 10, and collectively, FIGS. 13-17, provide cross-sectional views along line BB' of the device 200 corresponding to FIGS. 7, 9, and 12, respectively. In the depicted embodiments, the line BB' corresponds to a cut along the longitudinal (or lengthwise) direction of a plurality of nanosheets (or nanowires, for example), i.e., generally perpendicular to a longitudinal direction of an active gate structure.

Figure 3:
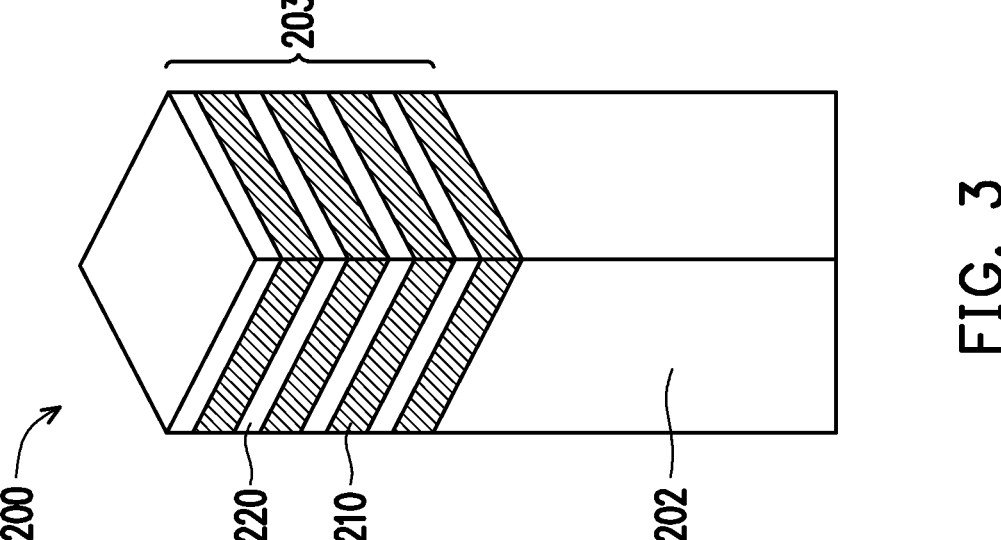
FIGS. 2, 3, 4, 5, 6, 7, 9, 11, 12, 21, 22, 23, and 24 illustrate perspective views of an example semiconductor device during intermediate stages of the method of FIG. 1, in accordance with some embodiments.
Figure 2:
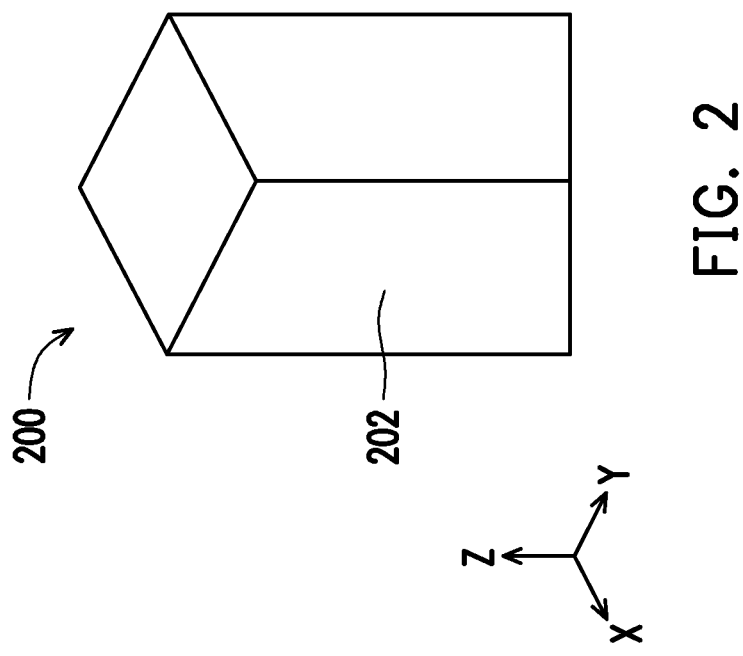

Referring to FIGS. 1-3, the method 100 at operation 102 forms the device 200 that includes a stack 203 of semiconductor layers protruding from a semiconductor substrate 202. In the present embodiments, the stack 203 includes a number of first semiconductor layers 210 and a number of second semiconductor layers 220 interleaved with the first semiconductor layers 210.

The semiconductor substrate 202 includes a semiconductor material, for example, silicon. Alternatively, the semiconductor substrate 202 may include other elementary semiconductor material such as, for example, germanium. The semiconductor substrate 202 may also include a compound semiconductor such as silicon carbide, gallium arsenic, indium arsenide, and indium phosphide. The semiconductor substrate 202 may include an alloy semiconductor such as silicon germanium, silicon germanium carbide, gallium arsenic phosphide, and gallium indium phosphide. In one embodiment, the semiconductor substrate 202 includes an epitaxial layer. For example, the semiconductor substrate 202 may include an epitaxial layer overlying a bulk semiconductor. Furthermore, the semiconductor substrate 202 may include a semiconductor-on-insulator (SOI) structure. For example, the semiconductor substrate 202 may include a buried oxide (BOX) layer formed by a process such as separation by implanted oxygen (SIMOX) or other suitable technique, such as wafer bonding and grinding.

In some embodiments, the semiconductor substrate 202 is or includes a doped well (or doped region) near a top surface of the semiconductor substrate 202. The doped well includes one or more suitable dopant configured to provide the device 200 of a desired conductivity type. In the present embodiments, the doped well includes a p-type dopant, such as boron. Alternatively, the semiconductor substrate 202 is doped with a p-type dopant, such as boron, and configured to provide an n-type transistor device. In this regard, rather than a region of the semiconductor substrate 202 being doped, an entirety of the semiconductor substrate 202 is doped with a suitable dopant, such as boron, for fabricating the device 200.

The first semiconductor layers 210 and the second semiconductor layers 220 (collectively referred to as the semiconductor layers 210 and 220) are alternately disposed on top of one another (e.g., along the Z direction) to form the stack 203. For example, one of the second semiconductor layers 220 is disposed over one of the first semiconductor layers 210 then another one of the first semiconductor layers 210 is disposed over the second semiconductor layer 220, so on and so forth. The stack 203 may include any number of alternately disposed semiconductor layers 210 and 220. The semiconductor layers 210 and 220 may have different thicknesses. The first semiconductor layers 210 may have different thicknesses from one layer to another layer. The second semiconductor layers 220 may have different thicknesses from one layer to another layer. The thickness of each of the semiconductor layers 210 and 220 may range from few nanometers to few tens of nanometers.

In the present embodiments, the semiconductor layers 210 and 220 have different compositions. In some embodiments, the two semiconductor layers 210 and 220 have compositions that provide for different oxidation rates and/or different etch selectivity between the layers. In some embodiments, the first semiconductor layers 210 include silicon germanium ($Si_{1-x}Ge_x$), and the second semiconductor layers 220 include silicon (Si). In some embodiments, each of the second semiconductor layers 220 includes silicon that may be undoped or substantially dopant-free (i.e., having an extrinsic dopant concentration from about 0 $cm^{-3}$ to about $1\times10^{17}$ $cm^{-3}$), where, for example, no intentional doping is performed when forming the second semiconductor layers 220.

One or both of the semiconductor layers 210 and 220 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 210 and 220 may be chosen based on their relative oxidation rates and/or etching selectivity.

The method 100 at operation 102 may form the semiconductor layers 210 and 220 by one or more epitaxial growth processes from the semiconductor substrate 202. For example, each of the semiconductor layers 210 and 220 may be formed by a selective epitaxial growth (SEG) process, a chemical vapor deposition (CVD) process (e.g., vapor-phase epitaxy (VPE) and/or ultra-high vacuum CVD (UHV-CVD)), molecular beam epitaxy (MBE), other suitable epitaxial processes, or combinations thereof. During the epitaxial growth process, the crystal structure of the semiconductor substrate 202 extends upwardly, resulting in the semiconductor layers 210 and 220 having the same crystal orientation with the semiconductor substrate 202.

Subsequently, the method 100 may form a mask layer (not depicted) over the stack 203 to protect the underlying layers from being damaged during subsequent operations. In some embodiments, the mask layer includes multiple layers such as, for example, a first hard mask layer and a second hard mask over the first hard mask layer. The first hard mask layer may be a thin film including silicon oxide. The first hard mask layer may act as an adhesion layer between the topmost first semiconductor layer 210 (or the topmost second semiconductor layer 220 in some other embodiments) and the second hard mask. In some embodiments, the second hard mask is formed of silicon nitride, silicon oxynitride, silicon carbonitride, the like, or combinations thereof. The first hard mask layer and the second hard mask may each be formed using thermal oxidation, chemical oxidation, CVD, atomic layer deposition (ALD), low-pressure chemical vapor deposition (LPCVD), plasma enhanced chemical vapor deposition (PECVD), or other suitable methods.

Figure 4:
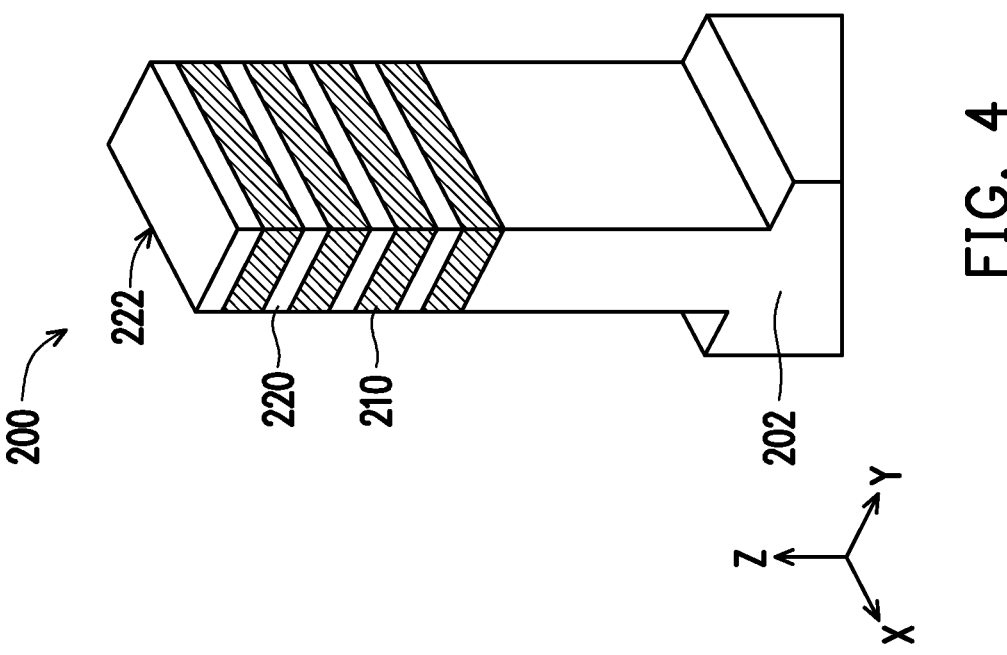

Referring to FIGS. 1 and 4, the method 100 at operation 104 defines a fin structure 222 in the stack 203. Although one fin structure 222 is shown in the present depiction for purposes of simplicity, it should be appreciated that the device 200 can include any number of fin structures 222 while remaining within the scope of the present disclosure, where the fin structures 222 may be arranged in a parallel configuration and spaced from each along the Y direction.

The fin structure 222 may be formed by patterning the stack 203 using, for example, photolithography and etching processes. For example, the mask layer that includes the first hard mask layer and the second hard mask may be patterned using photolithography processes. Generally, photolithography processes utilize a photoresist material (not depicted) that is deposited, irradiated (or exposed), and developed to remove a portion of the photoresist material. The remaining photoresist material protects the underlying material, such as the mask layer in this example, from subsequent processing steps, such as etching.

Subsequently, the photoresist material is used to form a patterned mask layer (not shown) by an etching process. Exposed portions of the stack 203 and the semiconductor substrate 202 are then etched using the patterned mask layer as an etch mask to form trenches (or openings; not depicted) in the stack 203, thereby defining the fin structure 222 between adjacent trenches. In some embodiments, the fin structure 222 is formed by etching trenches in the stack 203 and the underlying semiconductor substrate 202 using, for example, dry etch, wet etch, reactive ion etch (RIE), neutral beam etch (NBE), the like, or combinations thereof. The etching process may be anisotropic. In some embodiments, the trenches may be strips (when viewed from the top) parallel to one another, and closely spaced with respect to one another. In some embodiments, the trenches may be continuous and surround the fin structure 222. After the photolithography and etching processes are completed, the photoresist material is removed using any suitable method, such as plasma ashing or resist stripping.

Figure 5:
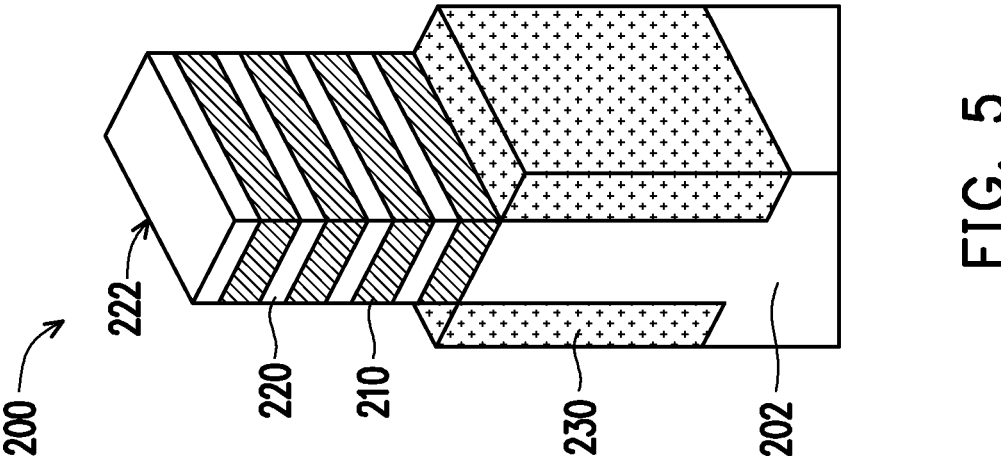

Referring to FIGS. 1 and 5, the method 100 at operation 106 forms isolation structures 230 around the fin structure 222 to separate it from adjacent fin structures 222. The isolation structures 230 may be formed over the semiconductor substrate 202 and partially embed lower portions of the fin structure 222. The isolation structures 230 may include silicon oxide, a low-k dielectric material (e.g., having a dielectric constant of less than about 3.9), phosphosilicate glass (PSG), borosilicate glass (BSG), boron-doped phosphosilicate glass (BPSG), undoped silicate glass (USG), the like, or combinations thereof. The isolation structures 230 may be formed by spin-on coating, high density plasma chemical vapor deposition (HDP-CVD), flowable CVD (FCVD) (e.g., a CVD-based material deposition in a remote plasma system and converts the deposited material to an oxide during a subsequent curing process), the like, or combinations thereof. Other dielectric materials and/or other formation processes may be used. In an example, the isolation structures 230 include silicon oxide formed by a FCVD process. An anneal process may be performed once the dielectric material is formed. The isolation structures 230 may be formed by depositing a dielectric (or insulating) material around the fin structure 222, performing a planarization process (e.g., a chemical-mechanical polishing, or CMP, process), and subsequently recessing the insulation material to form the isolation structures 230. In this regard, the isolation structures 230 may include a shallow-trench isolations (STIs).

Figure 7:
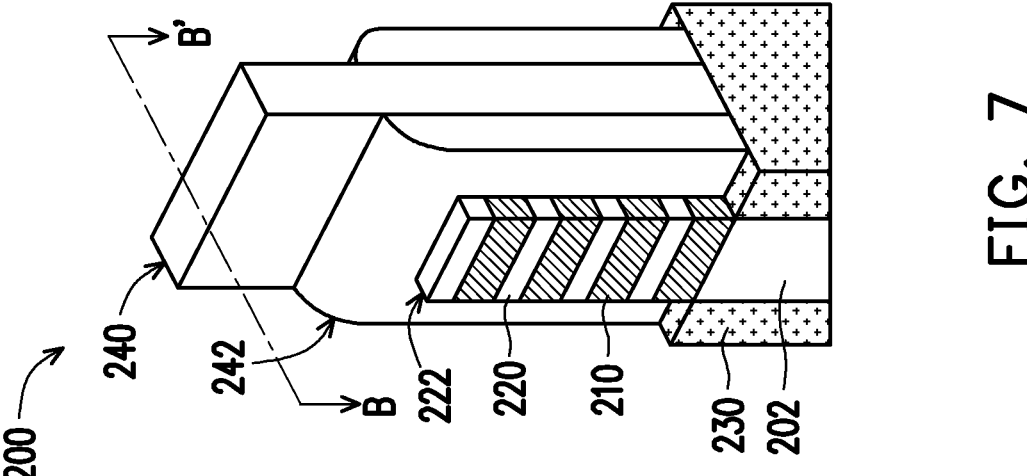
Figure 6:
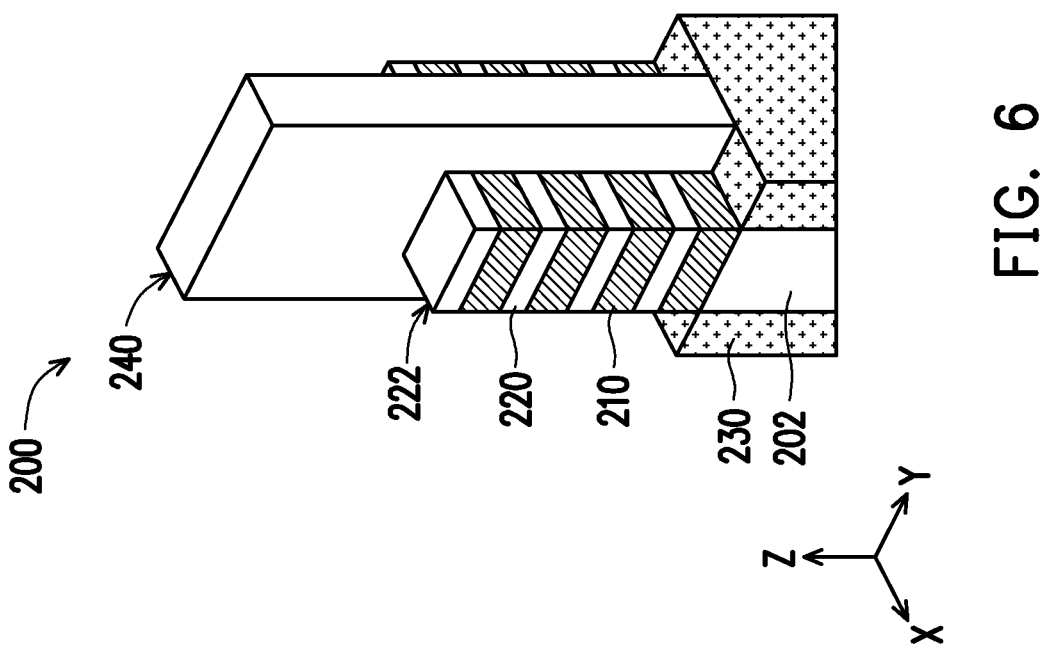

Referring to FIGS. 1, 6, and 7, the method 100 at operation 108 forms a dummy gate structure 240 over the fin structure 222.

Referring to FIG. 6, the dummy gate structure 240 may include one or more gate layers (not depicted separately), such as a dummy gate dielectric and a dummy gate electrode. The dummy gate dielectric may be optional and may include silicon oxide, silicon nitride, the like, or combinations thereof. The dummy gate electrode may be formed over the dummy gate dielectric and may include polysilicon.

To form the dummy gate structure 240, a dielectric layer (e.g., an interfacial layer; not depicted) may first be formed on the fin structure 222. The dielectric layer may include, for example, silicon oxide, and may be deposited or thermally grown. The dummy gate dielectric (if included) and the dummy gate electrode may then be formed as blanket layers over the dielectric layer. A mask layer (not depicted) may be formed over the blanket layers and may include silicon nitride, for example. The mask layer may be subsequently patterned to form the dummy gate structure 240 using acceptable photolithography and etching techniques similar to those described above with respect to operation 104. The dummy gate structure 240 traverses a central portion (e.g., a channel region) of the fin structure 222 and extend in a lengthwise direction (e.g., the Y direction) substantially perpendicular to the lengthwise direction (e.g., the X direction) of the fin structure 222.

Subsequently, referring to FIG. 7, gate spacers 242 may be formed along sidewalls of the dummy gate structure 240. The gate spacers 242 may include one or more dielectric material, such as silicon oxide, silicon oxycarbonitride, a low-k dielectric material, silicon nitride, silicon oxynitride, silicon carbonitride, the like, or combinations thereof. The gate spacers 242 may include one or more spacer layers. Any suitable deposition method, such as thermal oxidation, chemical oxidation, CVD, ALD, or the like, may be used to form a blanket spacer layer (not depicted) over the dummy gate structure 240, and the blanket spacer layer is etched by an anisotropic etching process (e.g., a dry etch) to remove portions thereof, leaving behind the gate spacers 242.

Figure 8:
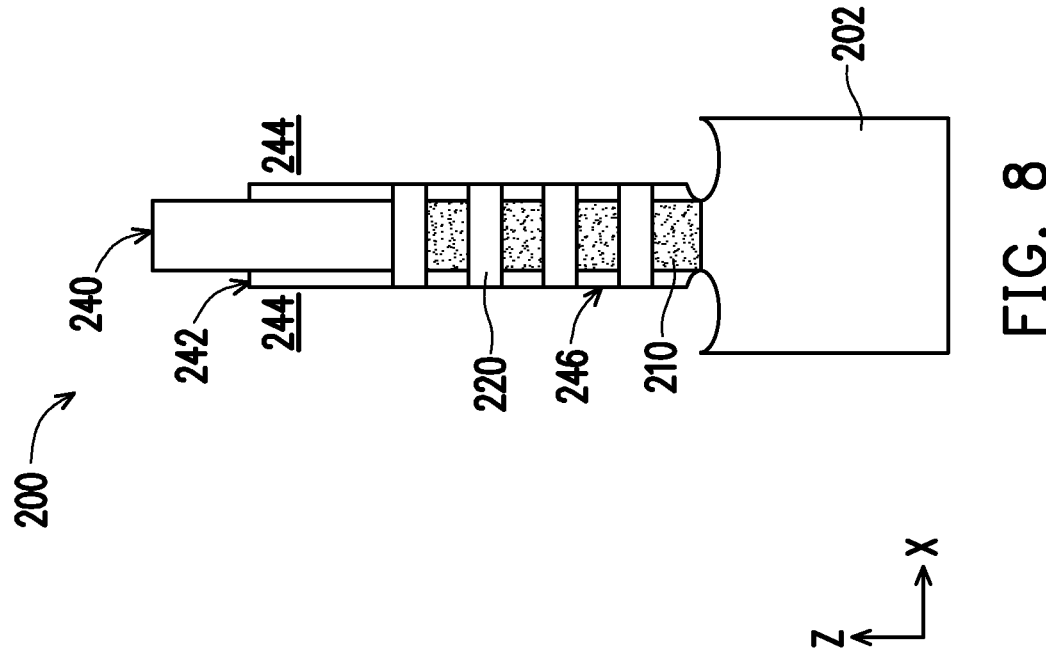
FIGS. 8 and 10 illustrate cross-sectional views along line BB' of the example semiconductor device corresponding to FIGS. 7 and 9, respectively, during intermediate stages of the method of FIG. 1, in accordance with some embodiments.

Referring to FIGS. 1 and 8, the method 100 at operation 110 forms inner spacers 246 on sidewalls of the first semiconductor layers 210 in source/drain recesses 244. FIG. 8 is a cross sectional view of the semiconductor device 200 along line BB' as shown in FIG. 7.

In some embodiments, forming the source/drain features 250 includes first etching (or removing) portions of the stack 203 to form the source/drain recesses 244 over the semiconductor substrate 202, such that the dummy gate structure 240 is interposed between the source/drain recesses 244. The source/drain recesses 244 may be formed by selectively etching the materials of the first semiconductor layer 210 and the second semiconductor layer 220 with respect to other components of the device 200, including the dummy gate structure 240 and the gate spacers 242. In some embodiments, portions of the semiconductor substrate 202 are removed to form the source/drain recesses 244. The source/drain recesses 244 may be formed by a wet etch process.

Subsequently, inner spacers 246 are formed on the sidewalls of the first semiconductor layers 210 exposed in the source/drain recesses 244. Forming the inner spacers 246 may include selectively etching the first semiconductor layers 210 with respect to the second semiconductor layers 220 to form lateral indents in the first semiconductor layers 210. A dielectric material (spacer layer) may then be deposited conformally over the device 200, such that the dielectric material fills the lateral indents and cover sidewalls of the second semiconductor layers 220. Subsequently, excess dielectric material (e.g., portions formed over the sidewalls of the second semiconductor layers 220) may be removed by a directional (e.g., anisotropic) etching, leaving behind the inner spacers 246 on the sidewalls of the first semiconductor layers 210 exposed in the source/drain recesses 244.

Figure 9:
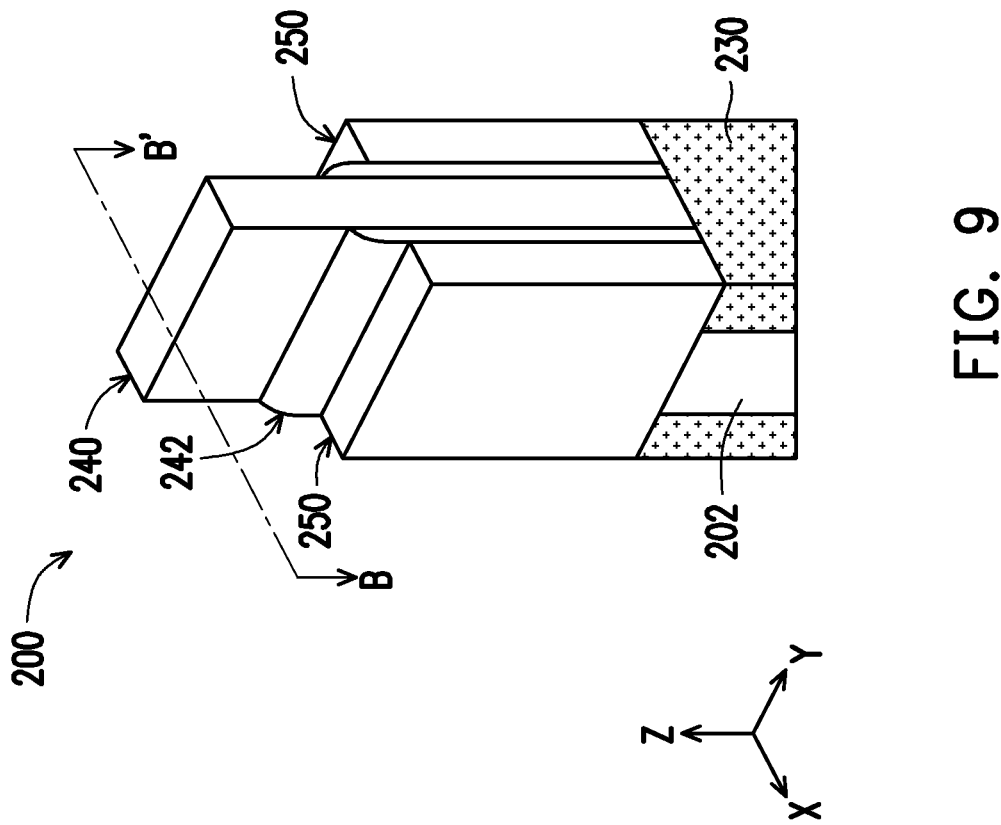
Figure 10:
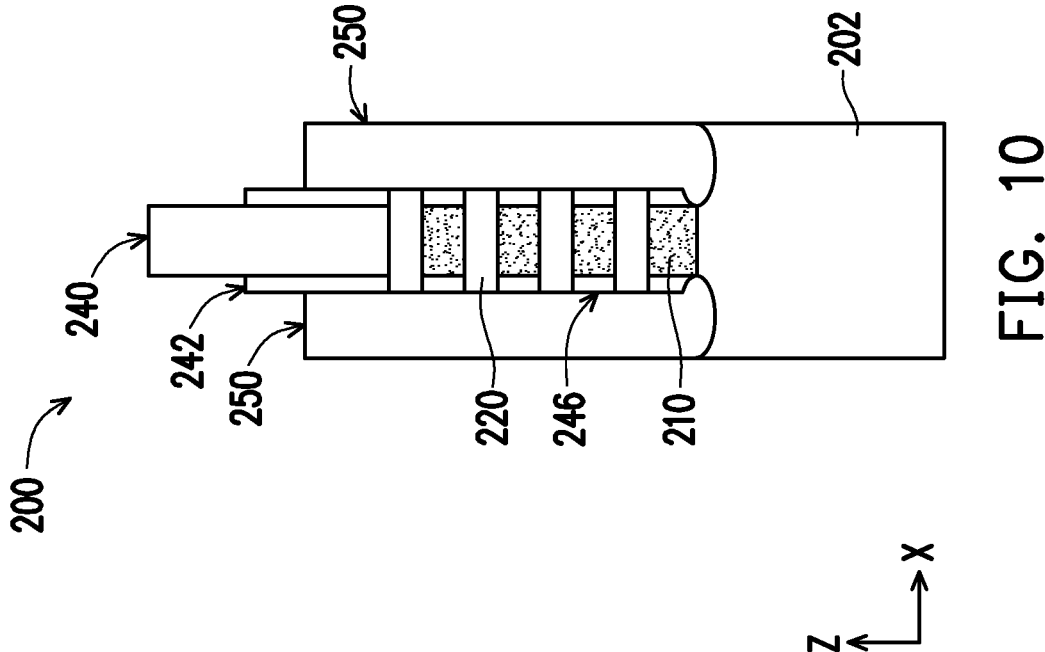

Referring to FIGS. 1, 9, and 10, where FIG. 10 is a cross sectional view of the semiconductor device 200 along the line BB' as shown in FIG. 9, the method 100 at operation 112 forms source/drain structures 250 in the source/drain recesses 244. The source/drain structures 250 are coupled to respective ends (along the X direction) of the fin structure 222, e.g., the respective "shortened" or "etched" ends of each of the semiconductor layers 220.

The source/drain structures 250 may each include epitaxial layers having silicon (Si), silicon carbon (SiC), silicon germanium (SiGe), or combinations thereof, depending on the desired conductivity type of the device 200. The source/drain structures 250 may be formed using an epitaxial growth process on exposed ends of each of the second semiconductor layers 220 and performing one or more implantation processes to dope the epitaxial layers, thereby forming the source/drain structures 250. In this regard, the source/drain structure 250 are laterally separated from the first semiconductor layers 210 by the inner spacers 246. The epitaxial growth process may include SEG process, CVD deposition techniques (e.g., VPE and/or UHV-CVD), MBE, other suitable epitaxial processes, or combinations thereof. In some embodiments, a bottom surface of the source/drain structures 250 may be lower than a top surface of the semiconductor substrate 202, as shown in FIG. 10.

In some embodiments, in-situ doping (ISD) is applied during the epitaxial growth process to form doped source/drain structures 250, thereby creating junctions for the device 200. For example, when the device 200 is configured as an n-type device, the source/drain structures 250 may include silicon or silicon carbon doped with n-type dopants, e.g., arsenic (As), phosphorous (P), or a combination thereof. When the device 200 is configured as p-type device, the source/drain structures 250 may include silicon germanium doped with p-type dopants, e.g., boron (B). In some embodiments, the dopants are implanted after epitaxially growing the source/drain structures 250 by a process such as ion implantation. In some embodiments, the source/drain structures 250 each include multiple layers of doped semiconductor material, where concentrations of the dopant(s) differ between the layers. In some embodiments, the source/drain structures 250 (or layers thereof) are heavily doped with a given dopant to ensure conductivity in source/drain structures 250 during operation. In the depicted embodiments, the device 200 is configured as an n-type device and the source/drain structures 250 are doped with an n-type dopant described herein. An annealing process may be performed after forming the doped source/drain structures 250 to activate the dopants implanted therein.

Referring to FIGS. 1 and 11-13, the method 100 at operation 114 removes the dummy gate structure 240 and the first semiconductor layers 210 from the semiconductor device 200.

Figure 11:
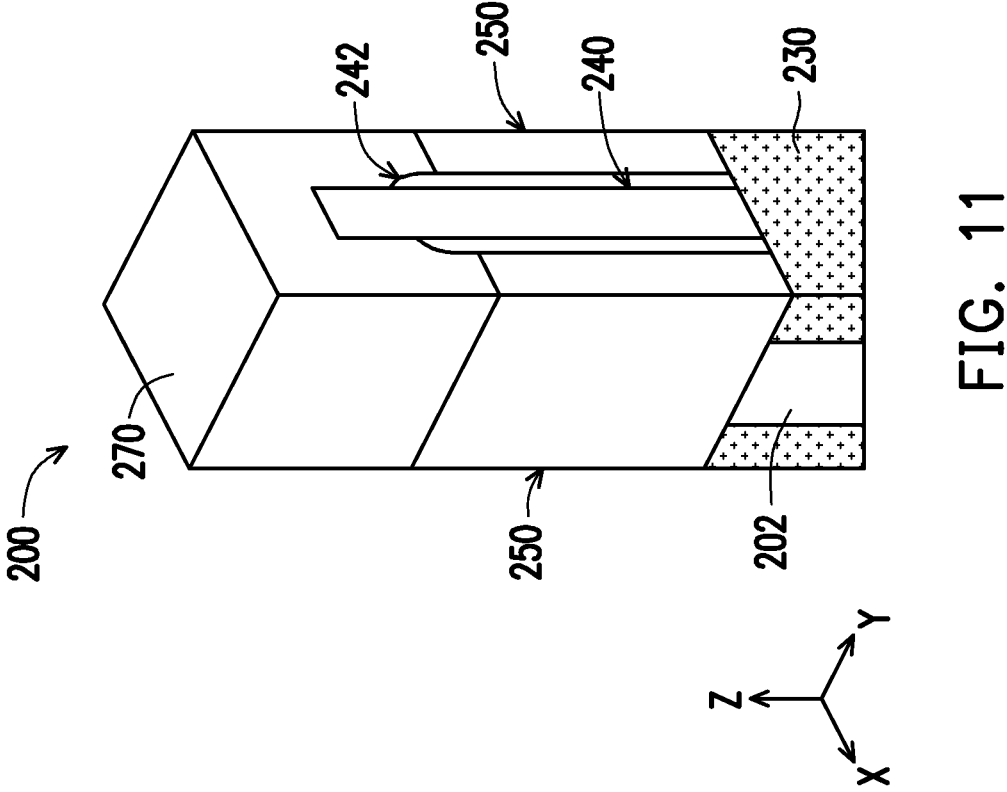

Referring to FIG. 11, an interlayer dielectric (ILD) 270 may be first formed over the device 200 to overlay at least the dummy gate structure 240 and the source/drain structures 250. In some embodiments, the ILD 270 includes a dielectric material such as silicon oxide, a low-k dielectric material, PSG, BSG, BPSG, USG, the like, or combinations thereof. The ILD 270 may be deposited by any suitable method, such as spin-on glass, CVD, PECVD, FCVD, or combinations thereof. Though not depicted, a planarization process, such as a CMP process, may be performed to achieve a level top surface for the ILD 270 with respect to a top surface of the dummy gate structure 240. In some examples, an etch-stop layer (ESL; not depicted) may be formed over the device 200 before forming the ILD 270, where the ESL includes a dielectric material different from that of the ILD 270 to ensure etching selectivity therebetween.

Subsequently, referring to FIG. 12, the dummy gate structure 240 may be removed from the device 200 to form a gate trench 274 between the gate spacers 242 and portions of the source/drain structures 250. The dummy gate structure 240 may be selectively removed by an etching process, e.g., a dry etch, a wet etch, an RIE, or the like. In some embodiments, the etching process is selective to removing the dummy gate structure 240 with respect to at least the gate spacers 242, the ILD 270, and the source/drain structures 250.

Figure 12:
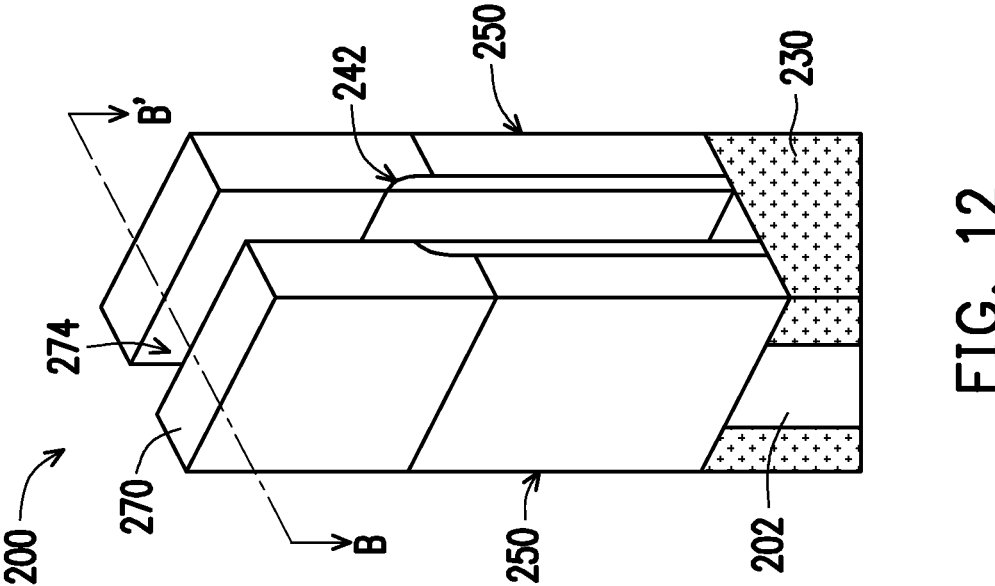
Figure 13:
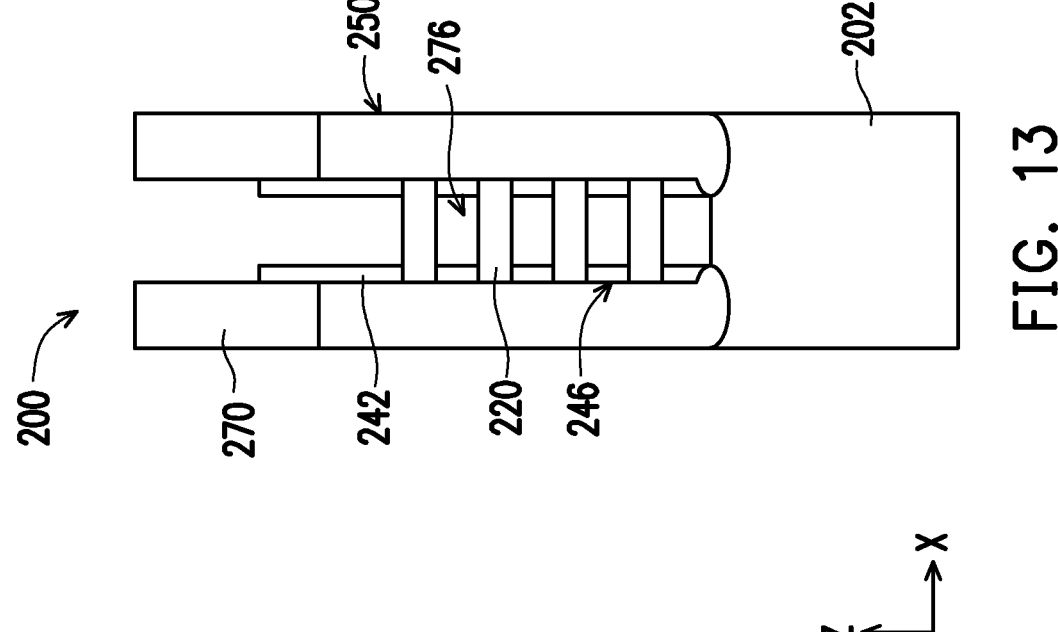

Referring to FIG. 13, which is a cross sectional view of the device 200 along the line BB' as shown in FIG. 12, the first semiconductor layers 210 are removed from the stack 203 to form openings 276 between the remaining second semiconductor layers 220. The first semiconductor layers 210, which may include SiGe, can be removed by performing a selective etching process, such as a selective wet etch utilizing hydrochloric acid, for example. The selective etching process does not remove, or substantially remove, the second semiconductor layers 220, which may include Si. The resulting openings 276 are laterally interposed between the inner spacers 246 and vertically aligned with the gate trench 274.

Referring to FIGS. 1, 14, 16 and 17, the method 100 at operation 116 forms a junction structure 260A in the semiconductor substrate 202 below the stack 203.

Figure 14:
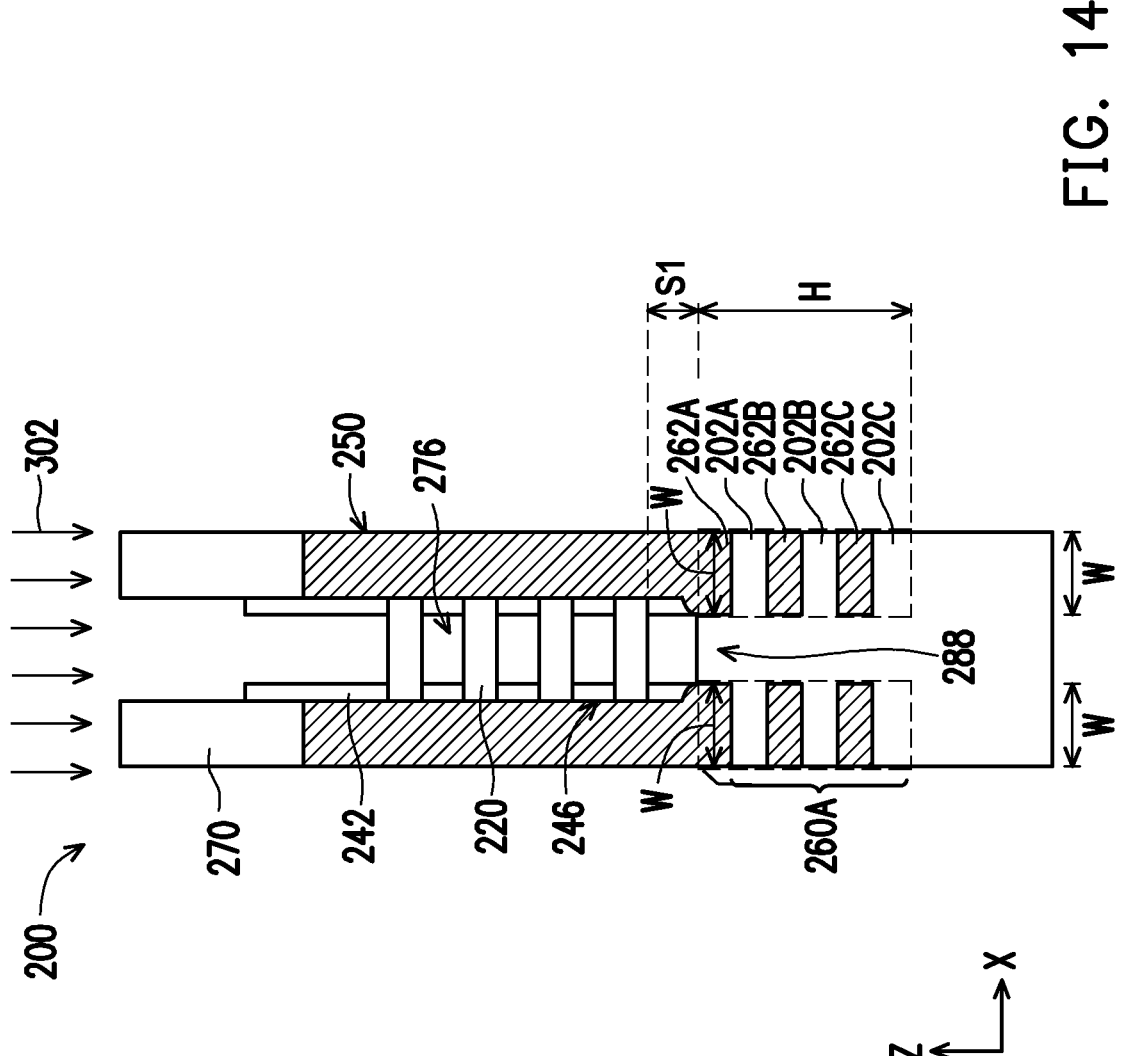
Figure 16:
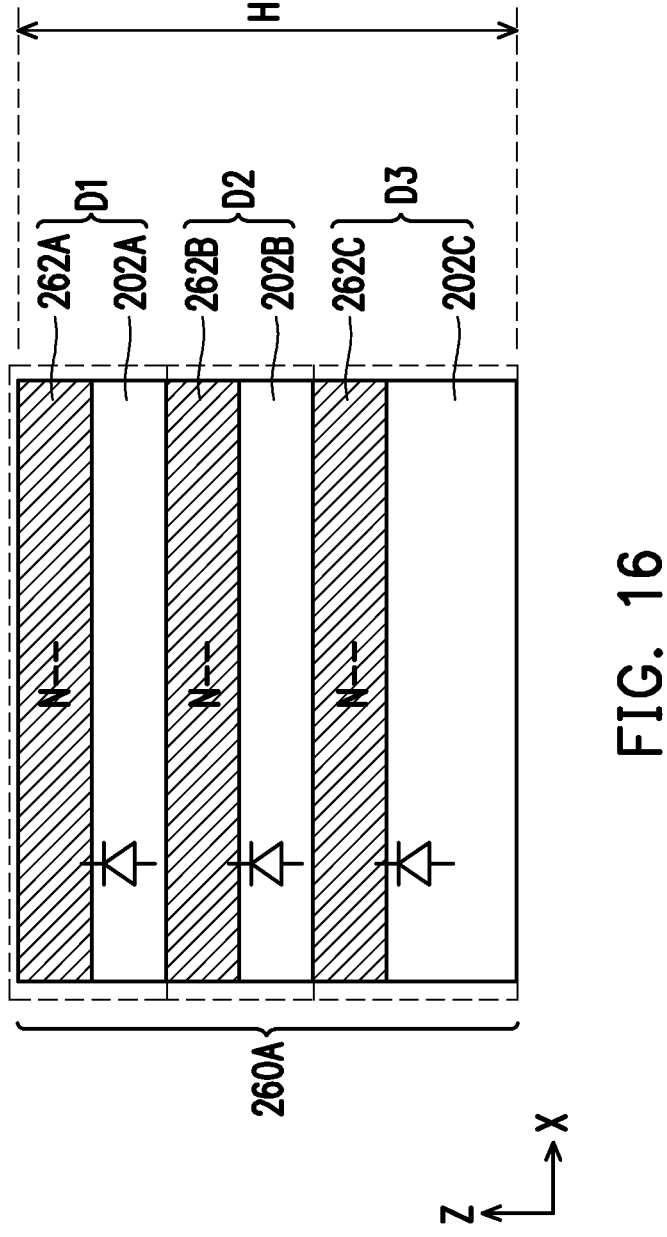
Figure 17:
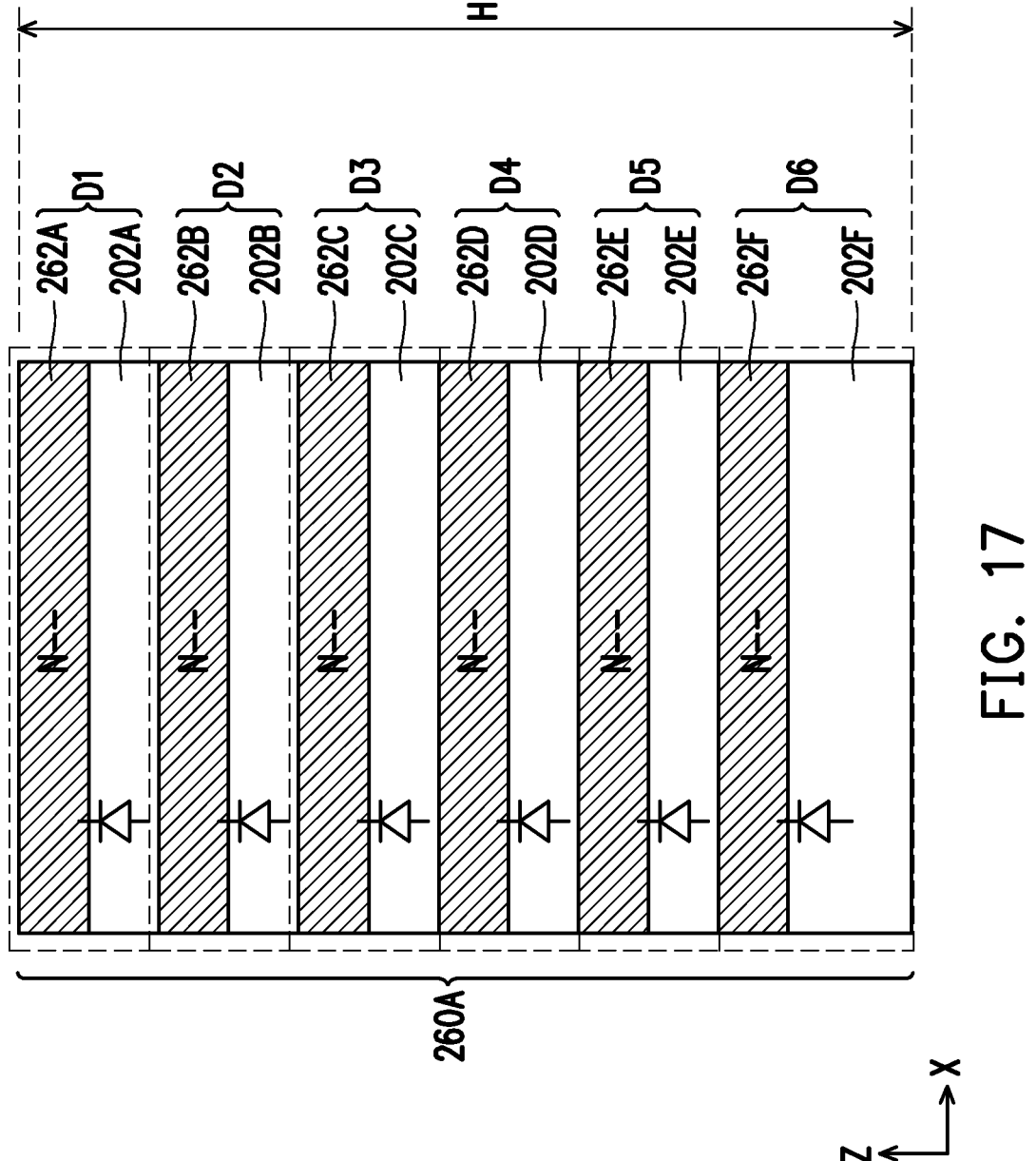

In the present embodiments, referring to FIGS. 14, 16, and 17, the junction structure 260A includes alternating semiconductor layers having impurities (or dopants) of different conductivity types, where the alternating semiconductor layers are coupled into multiple p-n junction diodes (hereafter referred to as junction diodes) stacked vertically along the Z-axis. In some embodiments, the number of junction diodes in the junction structure 260A is at least three. In the depicted embodiments of FIGS. 16 and 17, each junction diode is represented by the pair of semiconductor layers within the dashed enclosure. In the present disclosure, the junction structure 260A may be alternatively referred to as a super-junction structure for having more than one junction diode included therein.

Referring to FIGS. 14 and 16, where FIG. 16 is a detailed depiction of the junction structure 260A as shown in FIG. 14, the junction structure 260A includes three junction diodes D1, D2, and D3, where each junction diode includes an n-type region (or an n-well) coupled with a p-type region, which is a portion of the semiconductor substrate 202. For example, the junction diode D1 includes an n-type region 262A coupled with a p-type region 202A, the junction diode D2 includes an n-type region 262B coupled with a p-type region 202B, and the junction diode D3 includes an n-type region 262C coupled with a p-type region 202C. Similarly, referring to FIG. 17, which depicts a junction structure 260A having six junction diodes D1, D2, D3, D4, D5, and D6, coupled together, junction diode D4 includes an n-type region 262D coupled with a p-type region 202D, junction diode D5 includes an n-type region 262E coupled with a p-type region 202E, and junction diode D6 includes an n-type region 262F coupled with a p-type region 202F. In the present embodiments, the structure and function of each of the junction diodes D1-D6 are substantially the same. Due to a difference in types of primary charge carrier in the n-type region (i.e., electrons) and the p-type region (i.e., holes) of a junction diode, a depletion region exists at an interface between the doped regions, where a width of the depletion region may vary depending on the direction and magnitude of the voltage applied to the device 200 (i.e., the junction structure 260).

For embodiments in which the semiconductor substrate 202 includes silicon, a built-in potential (or potential barrier) $V_{bi}$ of the junction diode D1 (or D2, D3, etc.) at zero bias may be about 0.6 V to about 0.7 V, which indicates a tolerance to voltage applied to the junction diode D1. In this regard, coupling a plurality (e.g., at least one) of junction diodes similar to the junction diode D1 to form the junction structure 260A increases the overall built-in potential of the junction structure 260, thereby improving the tolerance of the device 200 to higher voltage. In this regard, an increase in voltage tolerance $\Delta V$ is generally proportional to the number of junction diodes included in the junction structure 260A, or $\Delta V \sim n^* V_{bi}$, where n is the number of junction diodes coupled in series in the junction structure 260A. In one example, referring to FIGS. 14 and 16, the $\Delta V$ for the junction structure 260A that includes three junction diodes, D1, D2, and D3, is about 1.8±10% V. In another example, referring to FIG. 17, the $\Delta V$ for the junction structure 260A that includes six junction diodes, D1, D2, D3, D4, D5, and D6, is about 3.6±10% V. In the present embodiments, the number of junction diodes included in the junction structure 260A can be selected based on the level of voltage tolerance desired for the device 200, with a higher voltage tolerance corresponding to a higher number of junction diodes. Accordingly, the three-diode junction structure 260A may be utilized for devices that require a tolerance of about 1.8 V or less and the six-diode junction structure 260A may be utilized for devices that require a tolerance of about 3.6 V or less, e.g., about 2.5 V to about 3.3 V.

In the present embodiments, each n-type region 262A-262F includes an n-type dopant, such as phosphorous (P) and/or arsenic (As). A concentration (or dosage) of the n-type dopant may be about $5 \times 10^{15}$ cm$^{-3}$ to about $5 \times 10^{16}$ cm$^{-3}$ in each n-type region 262A-262F, though other values of dopant concentration may also be contemplated while remaining within the scope of the present disclosure. In some embodiments, the concentration of the n-type dopant in each n-type region 262A-262F is less than that of the source/drain structures 250. In this regard, the n-type regions 262A-262C may be considered "lightly doped," as indicated by the notation "N--" in FIGS. 16 and 17. In contrast, the concentration of n-type dopant in the source/drain structures 250 may be about $1 \times 10^{20}$ cm$^{-3}$ to about $1 \times 10^{21}$ cm$^{-3}$. In some embodiments, the n-type regions 262A-262F and the source/drain structures 250 include the same type(s) of n-type dopant. For example, the n-type regions 262A-262F and the source/drain structures 250 both include P but at different concentrations.

In some embodiments, referring to FIG. 14, the stack of junction diodes extends over a depth H along the Z-axis, where a topmost junction diode, e.g., junction device D1 as depicted, may be separated from a bottommost second semiconductor layer 220 by a distance S1 of at least about 10 nm. In some embodiments, the depth H varies with respect to the number of junction diodes in the junction structure 260A. For example, a junction structure 260A having three junction diodes D1, D2, and D3 as depicted in FIGS. 14 and 16 may be defined by a depth H of about 40 nm. On the other hand, a junction structure 260A having six junction diodes D1, D2, D3, D4, D5, and D6 as depicted in FIG. 17 may be defined by a depth H of about 90 nm. Other values of the distance S1 and the depth H may be contemplated while remaining within the scope of the present disclosure.

In some embodiments, referring to FIG. 14, the junction structure 260A is formed by performing a process 302 similar to the process of forming the source/drain structures 250 described above. For example, the process 302 may be implemented as a series of multiple ion implantation processes, a number of which corresponds to the number of junction diodes (e.g., D1, D2, D3, etc.) intended to be included the junction structure 260A. Furthermore, the implantation processes are implemented at different energy levels that correspond to positions (e.g., depths) of the n-type regions (e.g., 262A, 262B, 262C, etc.) relative to the bottommost second semiconductor layer 220. For example, referring to FIGS. 14 and 16, the n-type regions 262A, 262B, and 262C are formed by implantation processes implemented at 5 keV, 10 keV, and 15 keV, respectively. Similarly, referring to FIG. 17, the n-type regions 262A, 262B, 262C, 262D, and 262F are formed by implantation processes implemented at 5 keV, 10 keV, 15 keV, 20 keV, 25 keV, and 30 keV, respectively. In some embodiments, referring to FIG. 14, the n-type regions 262A-262C are formed by doping portions of the semiconductor substrate 202 that extend laterally below the pair of source/drain structures 250 and therefore do not extend under a channel region 288 of the device 200. In some embodiments, the junction structure 260A is vertically aligned with the source/drain structures 250. For example, the junction structure 260A and a bottom portion of the source/drain structures 250 can both be defined by a width W.

In some embodiments, as depicted in FIG. 14, the process 302 is performed at operation 116, which is implemented after the formation of the ILD layer 270 and the removal of the dummy gate structure 240 and the first semiconductor layers 210. In some embodiments, forming the ILD layer 270 before performing the process 302 may help control a thickness of the n-type regions 262A-262C during the implantation processes.

Figure 15:
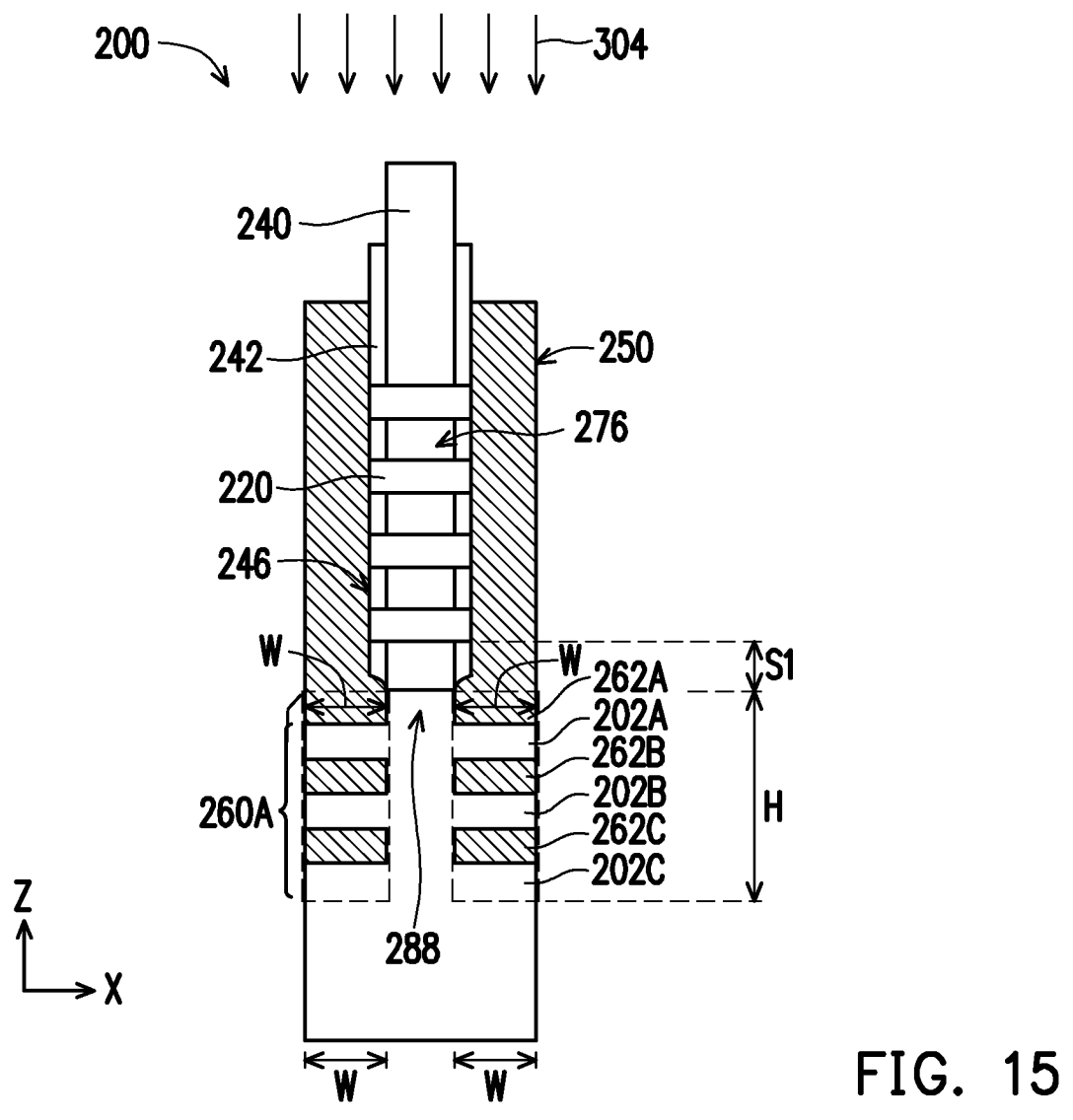

In some embodiments, referring to FIG. 15, the junction structure 260A is formed by a process 304 at operation 116, which includes a series of implantation processes implemented before forming the ILD layer 270 (and removing the dummy gate structure 240 and the first semiconductor layers 210) at operation 114. In this regard, the process 304 (i.e., operation 116) may be implemented as a part of the formation of the source/drain structures 250 at operation 112. For example, after forming the epitaxial layer(s) of the source/drain structures 250, the process 304 may be implemented as a series of implantation processes to form the junction structure 260A in the semiconductor substrate 202 and subsequently form the doped source/drain structures 250 in the epitaxial layers. In this regard, by varying the energy of the implantation processes, the process 304 may be configured to form both the junction structure 260A and the source/drain structures 250 successively. Furthermore, the series of implantation processes may be tuned such that a concentration of the dopant (e.g., n-type dopant) varies between the n-type regions 262A-262C (or 262A-262F) and the source/drain structures 250. In the present embodiments, the concentration of the dopant in the n-type regions 262A-262C is less than the concentration of the dopant in the source/drain structures 250.

The junction structure 260A formed by the process 304 is substantially similar to that formed by the process 302. For example, as depicted in FIG. 15, the junction structure 260A and the bottom portion of the source/drain structures 250 can both be defined by the width W. Subsequently, the method 100 proceeds from operation 116 to operation 114 to form the ILD layer 270 and remove the dummy gate structure 240 and the first semiconductor layers 210 as described in detail above.

Figure 18:
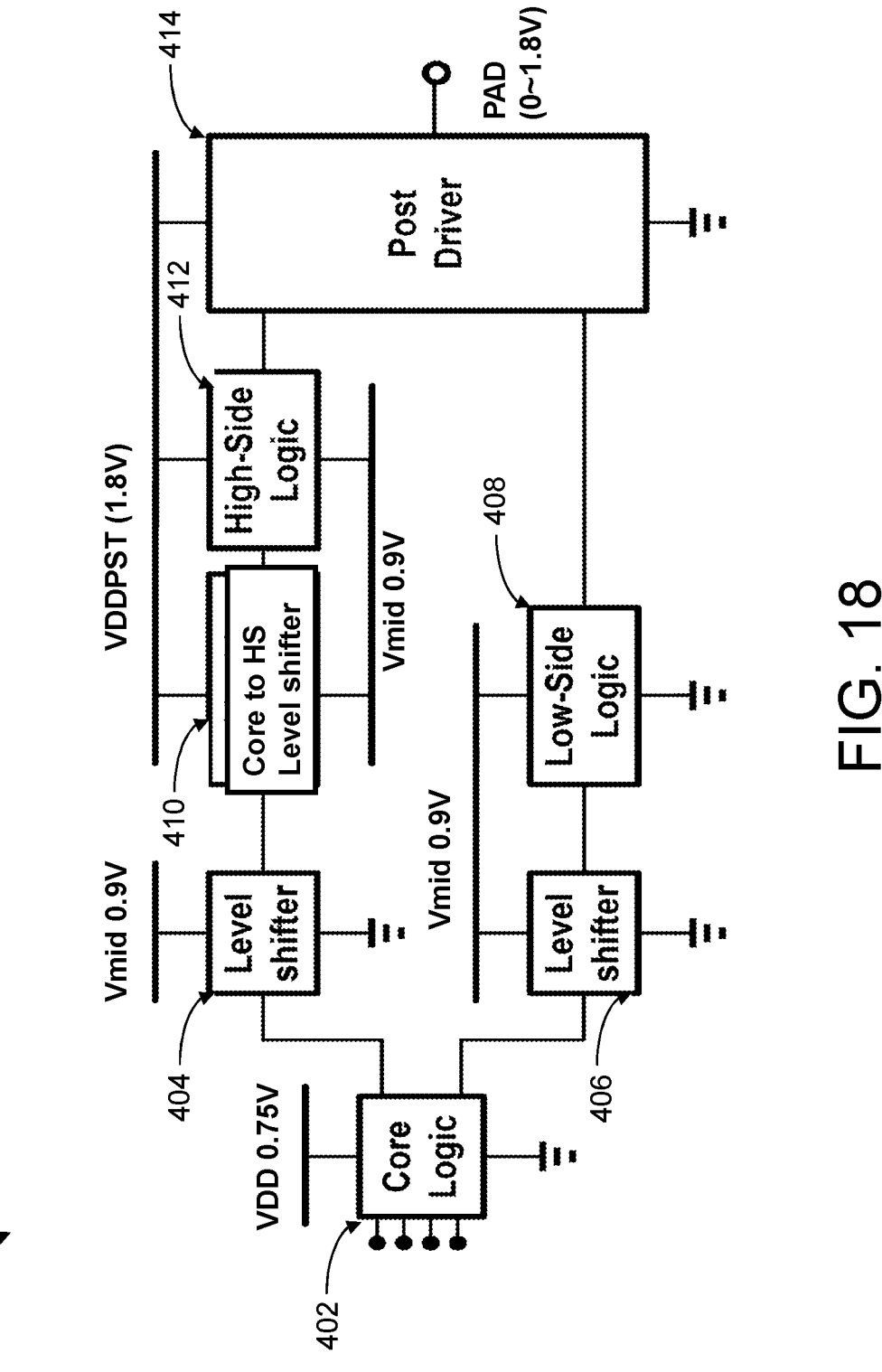
FIGS. 18, 19, and 20 illustrate schematic architecture of an example IC, or a portion thereof, in accordance with some embodiments.

FIG. 18 depicts a schematic circuit architecture 400 including at least one nanosheet device (e.g., the device 200). In the depicted example, voltage level within a core logic component 402 is considered a pre-driver voltage $V_{dd}$, voltage levels supplied by post driver 414 outside the core logic component 402, e.g., at a level shifter 404, 406, and/or 410, are each considered a post-driver voltage ($V_{mid}$ or $V_{ddpst}$). As shown, the level shifters 404, 406, and 410 translate signals at one core logic level to another, e.g., from the core logic component 402 to a high-side logic component 412 having a floating drive signal, or from the core logic component 402 to a low-side logical component 408 (e.g., a gate driver), which may be referred to as a device (e.g., a MOSFET) that is grounded such that its drive signal is based on the ground signal.

In existing implementations, nanosheet devices can generally sustain core-only, relatively low level of $V_{dd}$ (e.g., 0.98 V). In this regard, a single p-n junction diode in existing nanosheet devices may be faced with $V_{dd}$ constraint and may not tolerate higher voltage levels. This may pose challenges when designing nanosheet device-based IC chips (e.g., SoC chips) that include high-voltage I/O applications. Furthermore, nanosheet devices may not be easily controlled under high-speed conditions. Accordingly, methods of improving the voltage tolerance of nanosheet devices are desired.

The present disclosure provides nanosheet devices (e.g., the device 200) configured with multiple stacked junction diodes (e.g., the junction structure 260A or 260B, which is an alternative embodiment to the junction structure 260A described in detail below) in a substrate (e.g., the substrate 202) below the device to increase the tolerable voltage level of the corresponding nanosheet devices. By adjusting the number of the stacked junction diodes, the voltage level tolerable to the nanosheet devices can be tuned accordingly, allowing the nanosheet devices be utilized in circuit architecture for various applications (e.g., high-voltage I/O applications).

Figure 19:
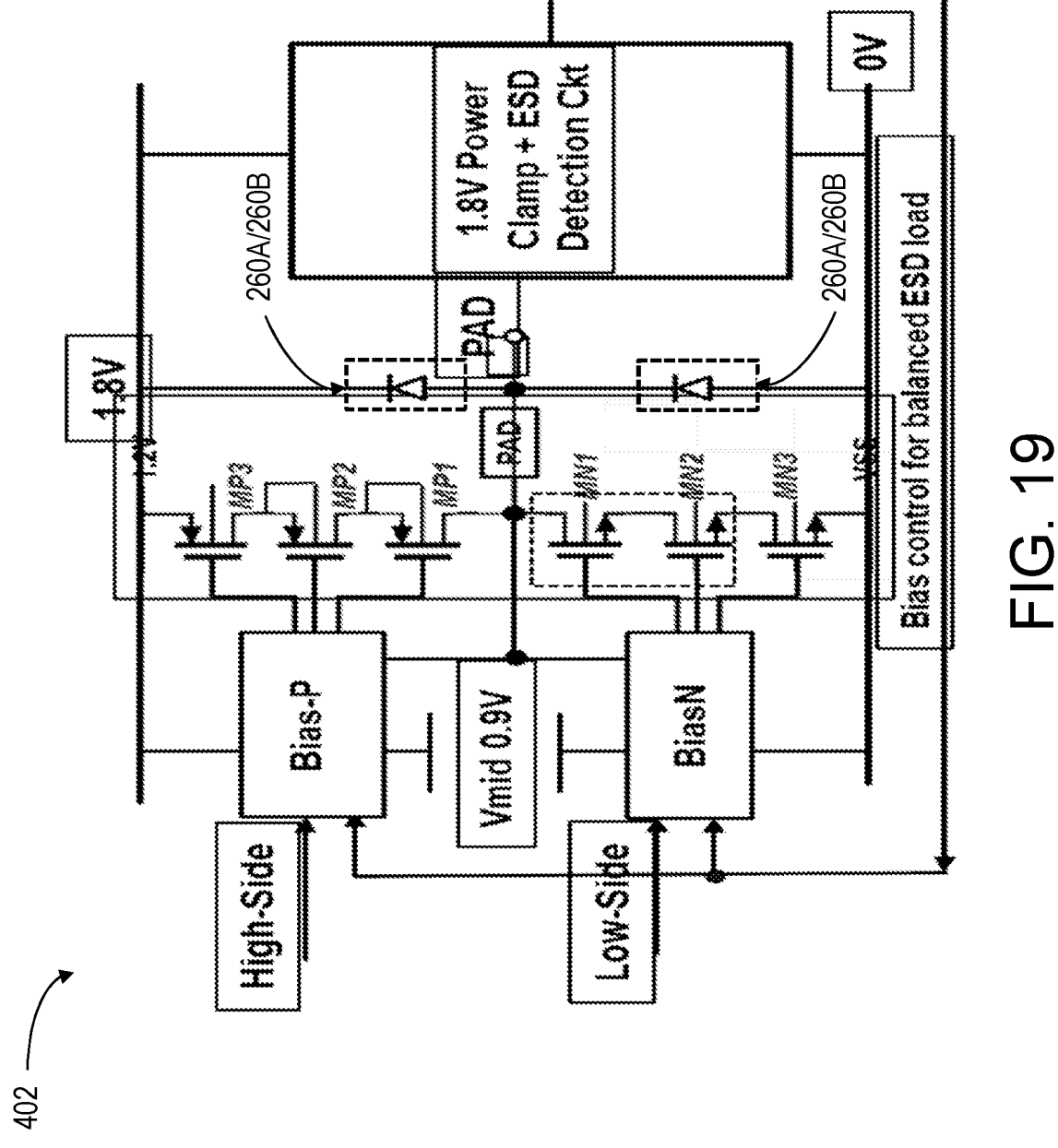

Referring to FIG. 19, which depicts a schematic of the core logic component 402 in FIG. 18, the junction structure 260A/260B may be incorporated as shown. Specifically, if the junction structure 260A/260B includes three junction diodes D1-D3, the ΔV is therefore about 1.8±10% V, allowing the core logic component 402 be utilized for applications requiring voltage levels at or below 1.8±10% V. Example applications may include an I/O pin of a mobile industry processor interface (MIPI). On the other hand, if the junction structure 260A/260B includes six junction diodes D1-D6, the ΔV is therefore about 3.6±10% V, allowing the core logic component 402 be utilized for applications requiring voltage levels at or below 3.6±10% V. Example applications may include a peripheral component interconnect express (PCIE) and a universal serial bus (USB), which may each require a voltage level of about 3.3 V. The present embodiments may also be applicable in a variety of high-speed interface devices and low-speed, high-voltage interface devices, each having a voltage requirement ranging from about 1.2 V to about 3.3 V.

Figure 20:
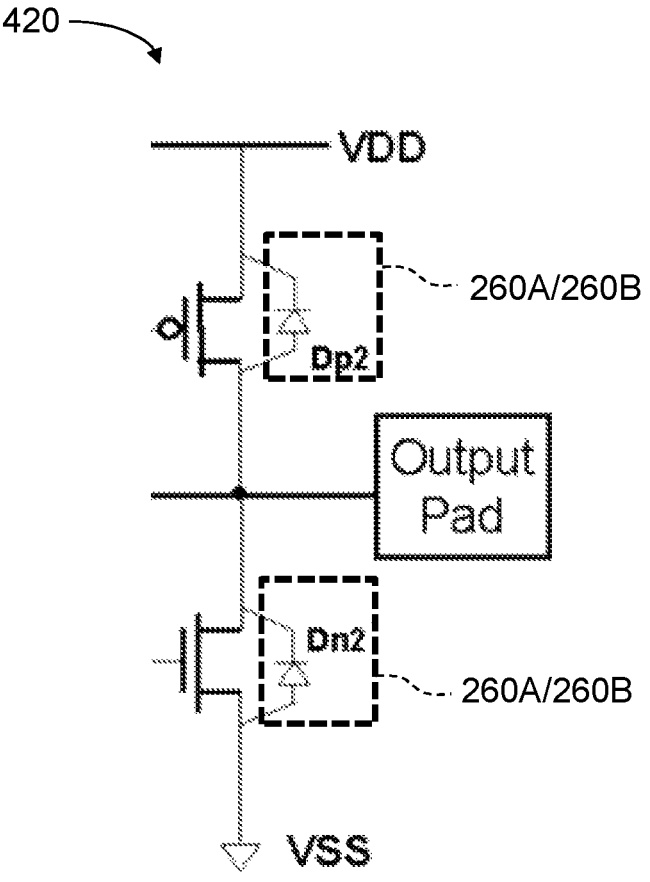

FIG. 20 depicts a circuit diagram 420 incorporating the junction structure 260A/260B to improve protection of the circuit against electrostatic discharge (ESD). ESD may threaten an electronic system when replacing a cable or even making contact with an I/O port. Discharges that accompany such routine events may disable the I/O port by destroying one or more of interface ICs. In some instances, the ESD may cause damage to a device when Vab is greater than about 1.32 V. By reverse-biasing the junction diodes (e.g., D1, D2, D3, etc.) in the junction structures 260A/260B, where the junction diodes are configured to tolerate a voltage level greater than 1.32V, the device 200 is tuned to withstand the effect of the ESD effect, avoiding potential damage to the circuit. In some embodiments, the junction structure 260A/260B allows nanosheet devices to be applied in one or more of the abovementioned applications in which relatively high voltage may be desired for the circuit to meet a variety of design requirements, including DC rating, transient conditions, and/or ESD protection.

Figure 21:
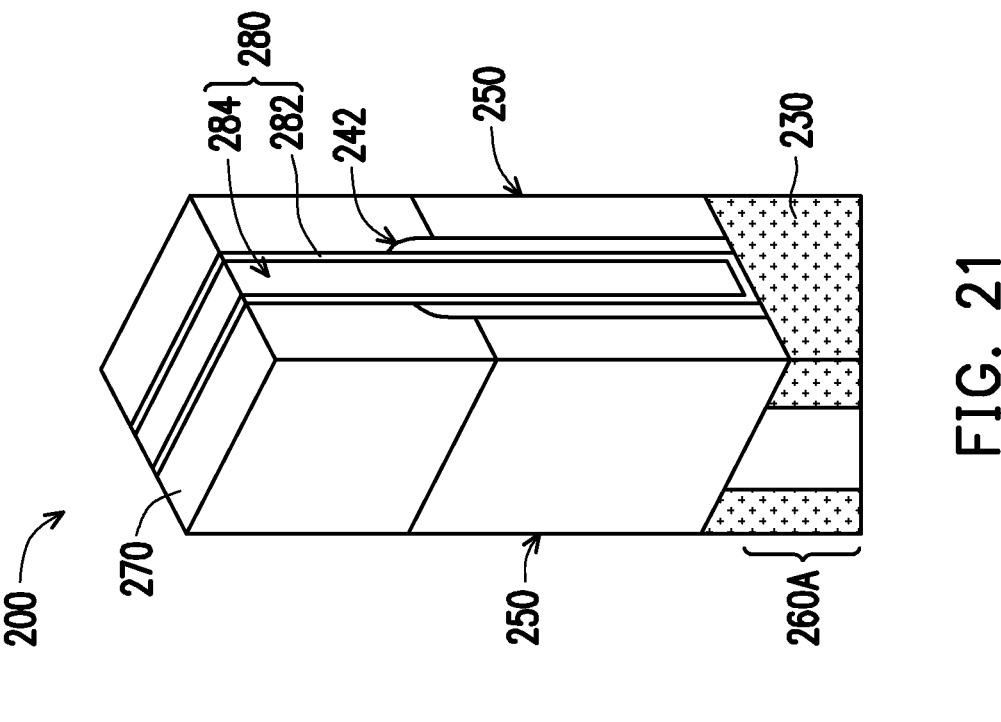
Figure 22:
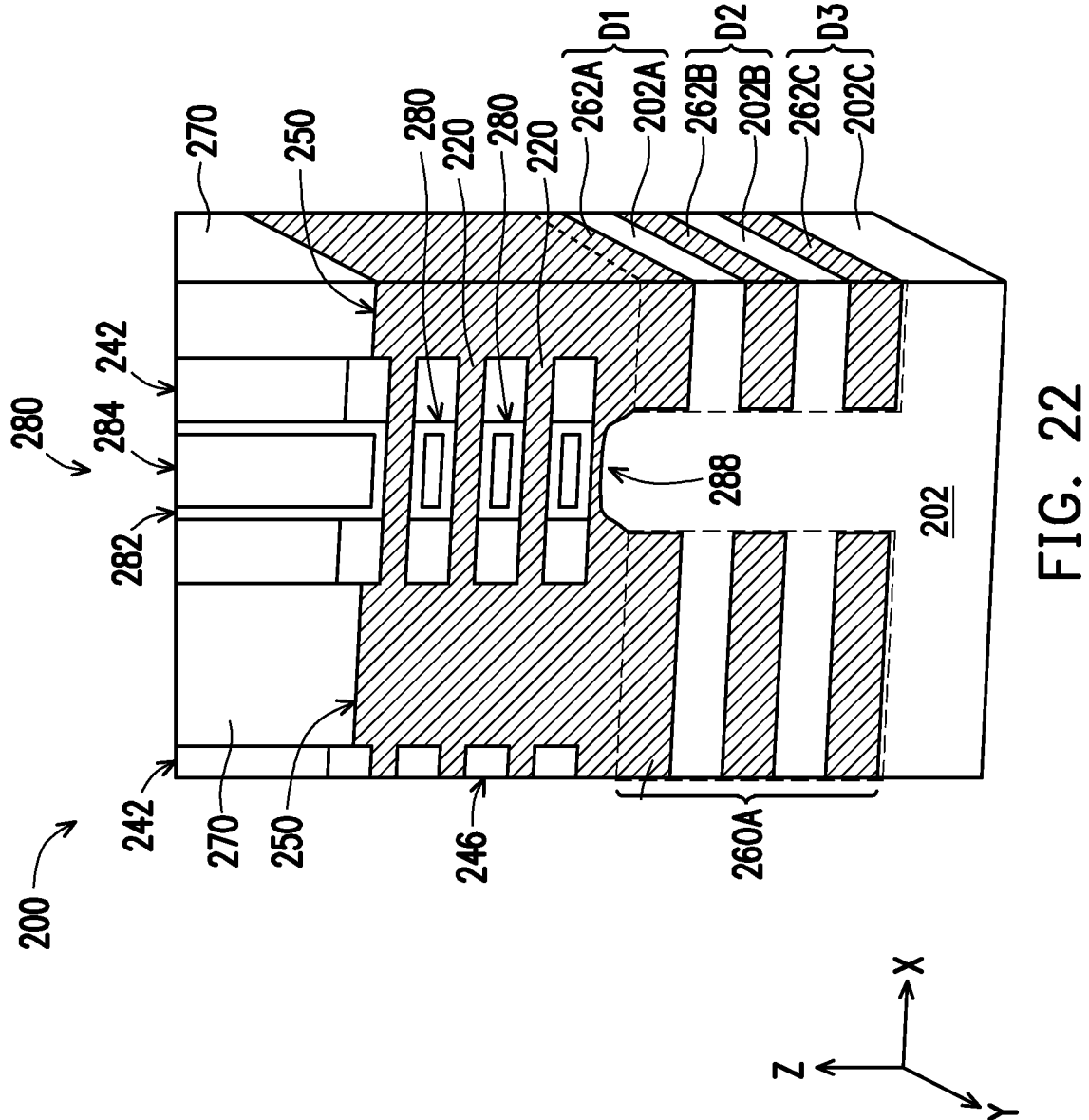
Figure 23:
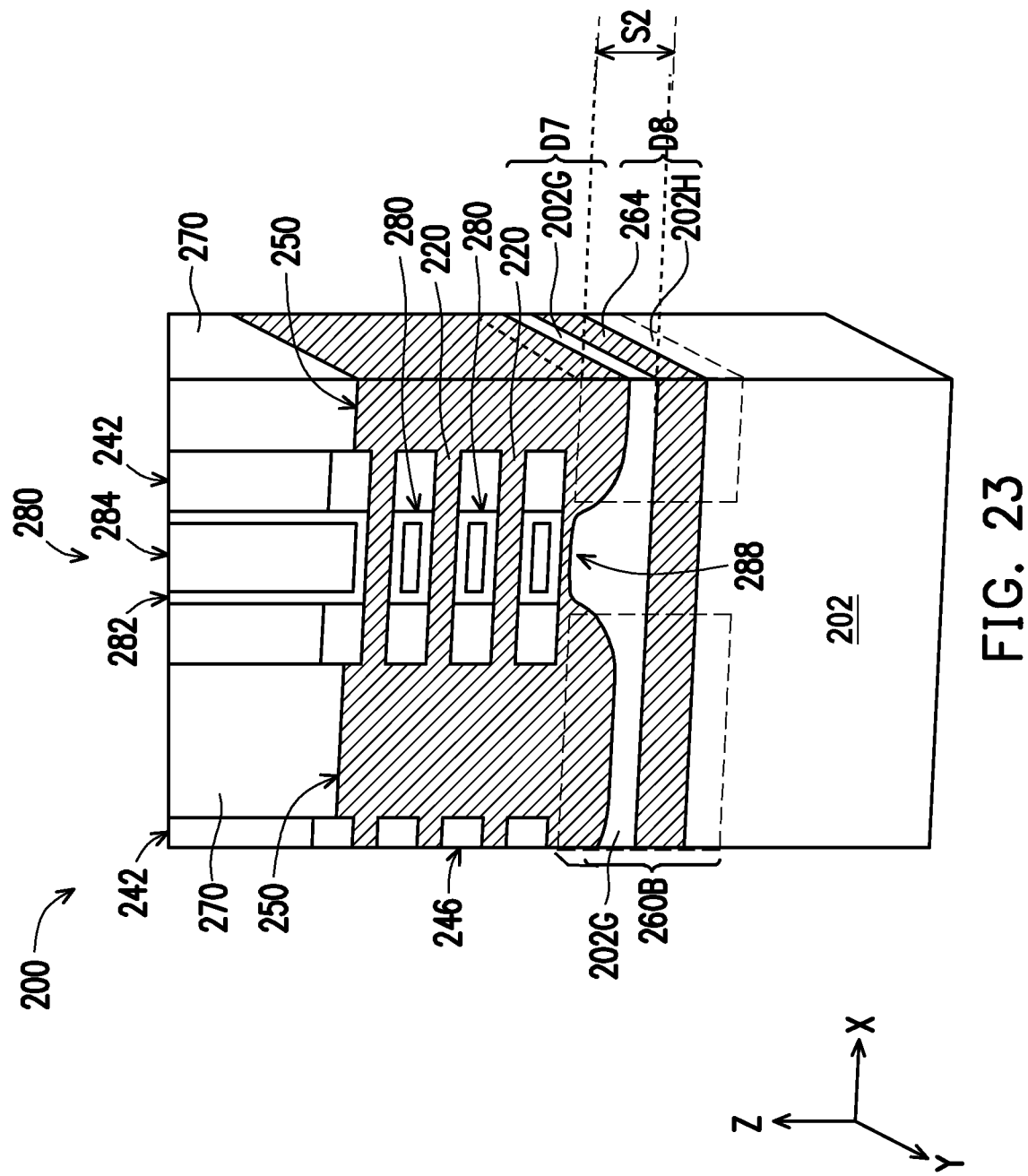

Referring to FIGS. 1, 21, and 22, the method 100 at operation 118 forms an active gate structure (or a metal gate structure) 280 to fill the gate trench 274 and the openings 276. The active metal gate structure 280 includes at least a gate dielectric 282 and a gate electrode 284 over the gate dielectric 282. FIG. 22 is a three-dimensional view of the device 200 in a perspective different from that of FIG. 21.

In the present embodiments, forming the metal gate structures 280 includes forming at least the gate dielectric 282 over the gate spacers 242 and the inner spacer 246, and the gate electrode 284 over the gate dielectric 282, where the gate dielectric 282 wraps around the each second semiconductor layer 220. As shown in FIG. 22, the gate dielectric 282 is formed on top, bottom, and sidewall surfaces of each opening 276. The gate dielectric 282 may include a high-k dielectric material, such as an oxide of Hf, Al, Zr, La, Mg, Ba, Ti, Pb, the like, or combinations thereof. The gate dielectric 282 may include a stack of multiple high-k dielectric materials. The gate dielectric 282 may be deposited using any suitable method, CVD, ALD, PVD, the like, or combinations thereof. In some examples, the gate dielectric 282 may optionally include a substantially thin oxide (e.g., $SiO_x$) layer underlying the high-k dielectric material.

The gate electrode 284 wraps around each of the second semiconductor layers 220 with the gate dielectric 282 disposed therebetween. Specifically, the gate electrode 284 may include a number of gate metal sections abutted to each other along the Z-axis. Each of the gate metal sections can extend not only along a horizontal plane (e.g., the plane expanded by the X-axis and the Y-axis), but also along a vertical direction (e.g., the Z-axis). As such, two adjacent ones of the gate metal sections can adjoin together to wrap around a corresponding one of the second semiconductor layers 220, with the gate dielectric 282 disposed therebetween.

The gate electrode 284 may include a work function layer (not depicted), such as a P-type work function layer, an N-type work function layer, multi-layers thereof, or combinations thereof. The work function layer may also be referred to as a work function metal. Example work function metals may include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, the like, or combinations thereof. The gate electrode 284 may further include a metal fill layer (not depicted) over the work function layer, where the metal fill layer may include W, Cu, Ru, Al, Ag, the like, or combinations thereof. The gate electrode 284 may further include other suitable layers, such as a barrier layer, an adhesion layer, a capping layer, other layers, or combinations thereof.

The various layers of the gate electrode 284 may be deposited by CVD, PVD, ALD, plating, other suitable methods, or combinations thereof, and subsequently planarized using one or more CMP processes.

In some embodiments, FIG. 22 depicts the device 200 having the junction structure 260A embedded in the substrate 202. In some embodiments, referring to FIG. 23, the device 200 alternatively includes the junction structure 260B embedded in the substrate 202. The junction structure 260B includes an p-type region 202G, which is a portion of the semiconductor substrate 202, coupled with a bottom portion of the source/drain structures 250, which is doped with an n-type dopant, to form a junction diode D7. The junction structure 260B further includes a p-type region 202H, which is also a portion of the semiconductor substrate 202, coupled with an n-type region 264 to form a junction diode D8.

In some embodiments, the n-type region 264 is a deep N-well (DNW) formed in the semiconductor substrate 202 by an implantation process at operation 102, e.g., before forming the fin structure 222, where the implantation process is similar to the process 302 or 304. For example, the n-type region 264 may be formed by performing an implantation process to dope a buried region of the semiconductor substrate 202 with an n-type dopant (e.g., phosphorus and/or arsenic). The n-type region 264 may be formed at a distance S2 below the bottommost second semiconductor layer 220, where the distance S2 may be about 20 nm to about 30 nm, for example.

Different from the n-type regions 262A-262F, which may include a concentration of n-type dopant of about $5\times10^{15}$ cm$^{-3}$ to about $5\times10^{16}$ cm$^{-3}$, the n-type region 264 has a greater concentration of n-type dopant than the n-type regions 262A-262F. In some embodiments, a concentration of the n-type dopant in the n-type region 264 is about $1\times10^{18}$ cm$^{-3}$ to about $1\times10^{20}$ cm$^{-3}$. In comparison, a concentration of the n-type dopant in the source/drain structures 250 is greater than that of the n-type region 264. For example, the concentration of n-type dopant in the source/drain structures 250 may be about $1\times10^{20}$ cm$^{-3}$ to about $1\times10^{21}$ cm$^{-3}$. Furthermore, different from the junction structure 260A, which may include three or more junction diodes, the junction structure 260B is configured to form two junction diodes, D7 and D8, as depicted, as only one n-type region 264 is formed in the semiconductor substrate 202. In this regard, the device 200 including the junction structure 260B may be utilized for devices that require a lower voltage tolerance, e.g., less than 1.4 V, than one that includes the junction structure 260A.

Further still, the junction structure 260B is vertically separated from a bottom surface of the source/drain structure 250 and laterally extends across an entirety of the semiconductor substrate 202, as it is formed directly in the semiconductor substrate 202 before forming any active device (e.g., a GAA transistor) thereover. As such, the n-type region 264 laterally extends under the channel region 288 of the device 200 between the pair of source/drain structures 250. In contrast, the n-type regions 262A-262F are formed at an interface between the bottom surface of the source/drain structures 250 and the semiconductor substrate 202 and therefore do not laterally extends under the channel region 288. As depicted in FIGS. 14, 15, and 22, the n-type regions 262A-262F laterally extend over a region that corresponds to the source/drain structures 250 and are vertically aligned with the source/drain structures 250.

Figure 24:
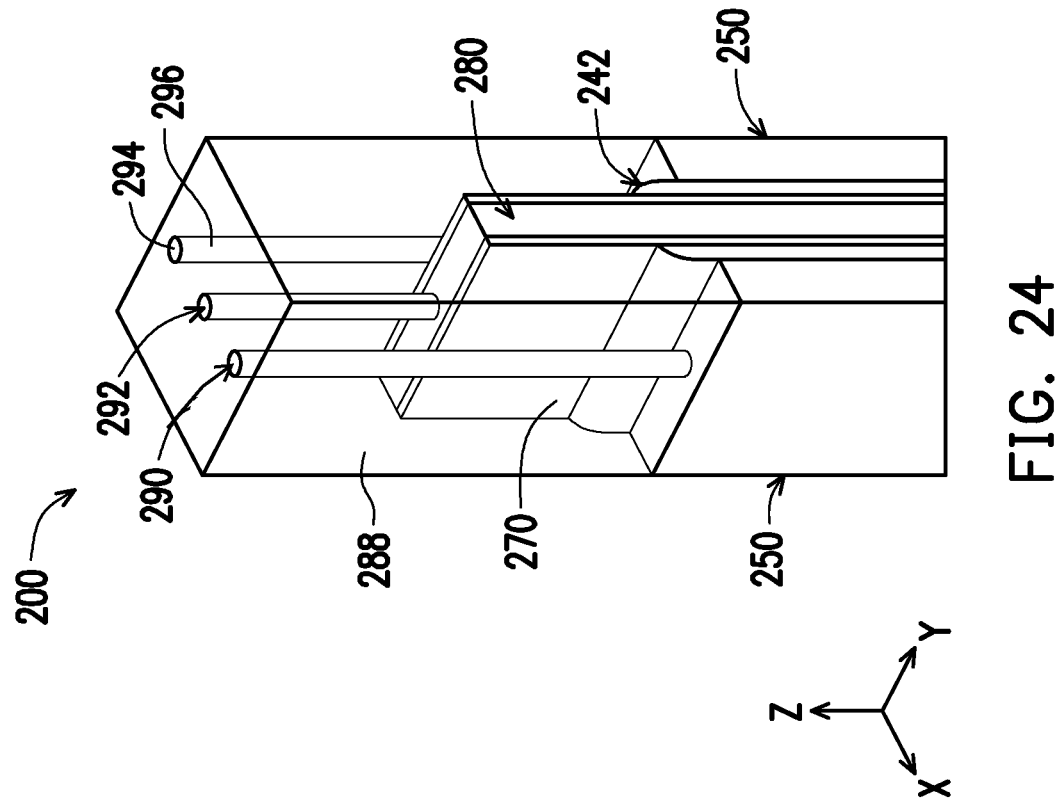

Referring to FIGS. 1 and 24, the method 100 at operation 120 forms various device-level contacts, including source/drain contacts 290 and a gate contact 292, to electrically connect the source/drain structures (e.g., the source/drain structures 250) and the active gate structure (e.g., the active gate structure 280), respectively, with interconnect structures, such as conductive lines and vias, formed in multiple dielectric layers over the device 200. The source/drain contacts 290 and the gate contact 292 may each include a suitable conductive metal fill 294, such as W, Cu, Ru, Al, Ag, the like, or combinations thereof, disposed over a barrier layer 296 having TiN, TaN, WN, the like, or combinations thereof. The source/drain contacts 290 and the gate contact 292 may be formed by first forming a dielectric structure 288 over the active gate structure 280, where the dielectric structure 288 may include multiple dielectric layers, such as ESLs and ILDs (e.g., the ILD 270), and subsequently forming the source/drain contacts 290 and the gate contact 292 in the dielectric structure 288 by a series of patterning and deposition processes. Additional interconnect structures (e.g., vias and conductive lines; not depicted) may be formed over the source/drain contacts 290 and the gate contact 292 to electrically couple to the device 200.

In one aspect, the present disclosure provides a semiconductor structure that includes a substrate and a stack of p-n junction structures embedded in the substrate. The semiconductor structure includes a semiconductor fin protruding from the substrate. The semiconductor structure includes a pair of source/drain structures disposed in the semiconductor fin. The semiconductor structure includes a gate structure over a channel region of the semiconductor fin and interposed between the pair of source/drain structures.

In another aspect, the present disclosure provides a semiconductor structure that includes a semiconductor substrate. The semiconductor structure includes a junction structure embedded in the semiconductor substrate, the junction structure including pairs of alternating p-type doped regions and n-type doped regions. The semiconductor structure includes a semiconductor fin protruding from the substrate, the semiconductor fin including semiconductor layers stacked along a vertical direction. The semiconductor structure includes a gate structure wrapping around a channel region of each semiconductor layer. The semiconductor structure includes a pair of source/drain structures disposed on respective sides of the gate structure.

In yet another aspect, the present disclosure provides a method. The method includes forming a semiconductor fin extending from a substrate, the substrate including a p-type doped layer and the semiconductor fin including alternating first semiconductor layers and second semiconductor layers. The method includes forming a dummy gate structure over a channel region of the semiconductor fin. The method includes forming source/drain features in the semiconductor fin adjacent the dummy gate structure. The method includes removing the dummy gate structure to form a gate trench and the first semiconductor layers to form openings. The method includes forming a stack of n-type doped layers vertically spaced from one another in the p-type doped layer. The method includes forming an active gate structure in the gate trench and the openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a stack of p-n junction structures embedded in the substrate;
a semiconductor fin protruding from the substrate;
a pair of source/drain structures disposed on respective sides of the semiconductor fin;
a gate structure over a channel region of the semiconductor fin and interposed between the pair of source/drain structures; and
a gate spacer disposed between the gate structure and the pair of source/drain structures, wherein the gate structure extends above a top surface of the gate spacer.

2. The semiconductor structure of claim 1, wherein the stack of p-n junction structures includes first portions of the substrate doped with an n-type dopant, the first portions being interleaved with second portions of the substrate doped with a p-type dopant.

3. The semiconductor structure of claim 2, wherein the pair of source/drain structures includes a first concentration of the n-type dopant and the first portions of the substrate include a second concentration of the n-type dopant, the second concentration being less than the first concentration.

4. The semiconductor structure of claim 1, wherein the substrate includes a region doped with a p-type dopant.

5. The semiconductor structure of claim 1, wherein the stack of p-n junction structures each extend laterally over a region corresponding to the pair of source/drain structures in a cascading configuration.

6. The semiconductor structure of claim 1, wherein the stack of p-n junction structures each extend along a longitudinal direction of the semiconductor fin and is stacked along a direction perpendicular to a top surface of the substrate.

7. The semiconductor structure of claim 1, wherein the stack of p-n junction structures extends from a bottom portion of the gate structure to a depth of about 10 nm to about 100 nm along a direction perpendicular to a top surface of the substrate.

8. The semiconductor structure of claim 1, wherein the semiconductor fin includes a plurality of semiconductor layers interleaved with the gate structure.

9. A semiconductor structure, comprising:
a semiconductor substrate;
a junction structure embedded in the semiconductor substrate, the junction structure including pairs of alternating p-type doped regions and n-type doped regions;
a semiconductor fin protruding from the semiconductor substrate, the semiconductor fin including semiconductor layers stacked along a vertical direction;
a gate structure wrapping around a channel region of each semiconductor layer;
a pair of source/drain structures disposed on respective sides of the gate structure; and a gate spacer extending above a top surface of the pair of source/drain structures, wherein the gate structure extends above a top surface of the gate spacer.

10. The semiconductor structure of claim 9, wherein the n-type doped regions each include an n-type dopant at a first concentration and the pair of source/drain structures each include the n-type dopant at a second concentration that is greater than the first concentration.

11. The semiconductor structure of claim 9, wherein the junction structure includes at least three pairs of the alternating p-type doped regions and n-type doped regions.

12. The semiconductor structure of claim 9, wherein each of the n-type doped regions includes phosphorous.

13. The semiconductor structure of claim 9, wherein each of the alternating p-type doped regions is a portion of the semiconductor substrate.

14. The semiconductor structure of claim 9, wherein the pairs of alternating p-type doped regions and n-type doped regions are aligned with the pair of the source/drain structures along the vertical direction.

15. The semiconductor structure of claim 9, wherein the junction structure extends from a bottom portion of the gate structure to a depth of about 10 nm to about 100 nm in the semiconductor substrate along the vertical direction.

16. A semiconductor structure, comprising:
an active gate structure having a first side and a second side opposite the first side, wherein the active gate structure is coupled to a gate contact;
a first dielectric layer disposed on the first side of the active gate structure and a second dielectric layer disposed on the second side of the active gate structure;
a first gate spacer disposed on the first dielectric layer and a second gate spacer disposed on the second dielectric layer;
a source structure disposed on the first gate spacer and a drain structure coupled to the second gate spacer, wherein the source structure is coupled to a source contact and the drain structure is coupled to a drain contact;
a semiconductor fin protruding from a substrate and disposed under the active gate structure, wherein the active gate structure extends above the first gate spacer and the second gate spacer; and
a stack of p-n junction structures embedded in the substrate.

17. The semiconductor structure of claim 16, wherein the source structure and the drain structure define a semiconductor fin protruding from a substrate.

18. The semiconductor structure of claim 16, wherein the source contact, the gate contact, and the drain contact each comprise a conductive metal disposed over a barrier layer.

19. The semiconductor structure of claim 16, further comprising a dielectric structure formed over the active gate structure.

20. The semiconductor structure of claim 16, wherein the first dielectric layer comprises a dielectric material different from a dielectric material of the second dielectric layer.

* * * * *